United States Patent [19]

Martin et al.

[11] Patent Number: 5,442,305

[45] Date of Patent: Aug. 15, 1995

[54] ACTIVE BUS TERMINATION DEVICE

[75] Inventors: Stephen R. Martin, San Jose; Randall O. Mooney, Jr., Boulder Creek, both of Calif.

[73] Assignee: Apple Computer, Inc., Cupertino, Calif.

[21] Appl. No.: 306,010

[22] Filed: Sep. 14, 1994

Related U.S. Application Data

[62] Division of Ser. No. 771,127, Oct. 3, 1991, Pat. No. 5,357,519.

[51] Int. Cl.⁶ ............................................. H03K 17/16
[52] U.S. Cl. ......................................... 326/30; 326/31
[58] Field of Search ................................. 326/30-31, 326/38

[56] References Cited

U.S. PATENT DOCUMENTS

| | | | |
|---|---|---|---|
| 4,450,370 | 5/1984 | Davis | 326/30 |
| 4,489,414 | 12/1984 | Titherley | 371/15.1 X |
| 4,675,551 | 6/1987 | Stevenson et al. | 326/30 |
| 4,694,408 | 9/1987 | Zaleski | 364/551 |
| 4,703,482 | 10/1987 | Auger et al. | 371/16.1 |
| 4,748,426 | 5/1988 | Stewart | 326/30 |
| 4,760,329 | 7/1988 | Andreano | 371/15.1 |
| 4,804,861 | 2/1989 | Hollstein et al. | 326/30 |
| 4,810,958 | 3/1989 | Mogi et al. | 371/15.1 X |
| 4,831,283 | 5/1989 | Newton | 326/30 |
| 4,831,560 | 5/1989 | Zaleski | 364/551.01 |
| 4,837,764 | 6/1989 | Russello | 371/16.1 |
| 4,953,165 | 8/1990 | Jackson | 371/16.1 |
| 5,029,284 | 7/1991 | Feldbaumer et al. | 326/30 |
| 5,111,080 | 5/1992 | Mizukami et al. | 326/30 |
| 5,157,665 | 10/1992 | Fakraie-Fard et al. | 371/15.1 |
| 5,168,216 | 12/1992 | Dance | 324/158 R |
| 5,228,039 | 7/1993 | Knoke et al. | 371/19 |

OTHER PUBLICATIONS

Apple Computer, Inc., *Inside Macintosh*, Vol. IV. (1986), pp. IV-238 through IV-295.

*Primary Examiner*—David R. Hudspeth
*Attorney, Agent, or Firm*—Blakely, Sokoloff, Taylor & Zafman

[57] ABSTRACT

A diagnostic apparatus for testing devices such as computer systems, and computer system components such as disk drives or printers. The device comprises a main unit, the main unit having a central processing unit for executing instructions, issuing commands, and receiving data from a first device. The apparatus also has a first peripheral unit coupled to the main unit, the first peripheral unit having ports for interfacing with the first device, the first peripheral unit being interchangeable with a second peripheral unit for interfacing with a second device. The apparatus also comprises a first non-volatile memory unit coupled to the main unit. The first non-volatile memory unit comprising a first set of tests for the first device, the first non-volatile memory unit being interchangeable with a second non-volatile memory unit comprising a second set of tests for a second device. These interchangeable parts are provided so that the user may test various types of hardware. The apparatus further comprises software means for providing termination on a bus and methods for simulating devices on a bus for remote entry into diagnostic programs.

5 Claims, 17 Drawing Sheets

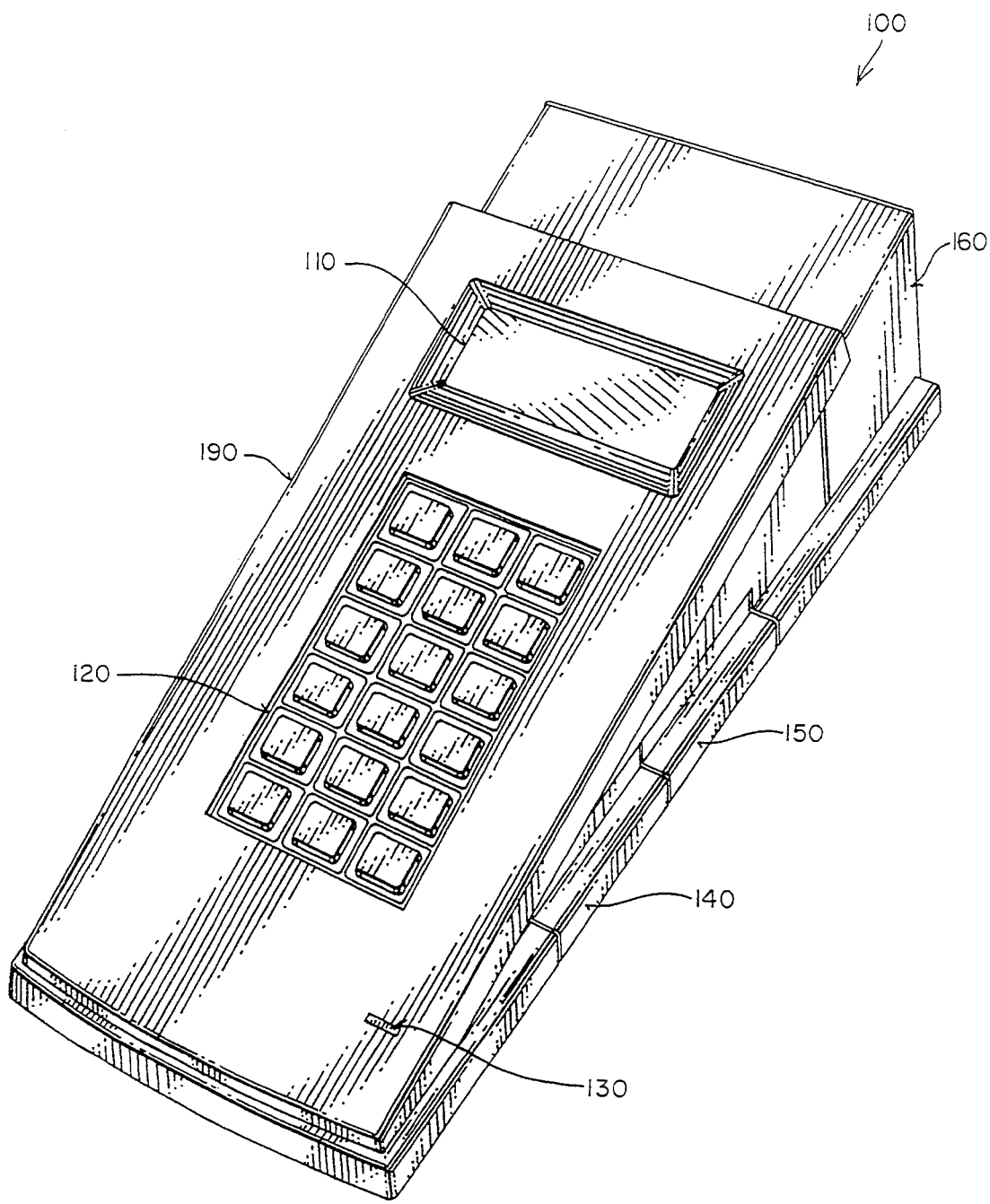
FIG _ 1

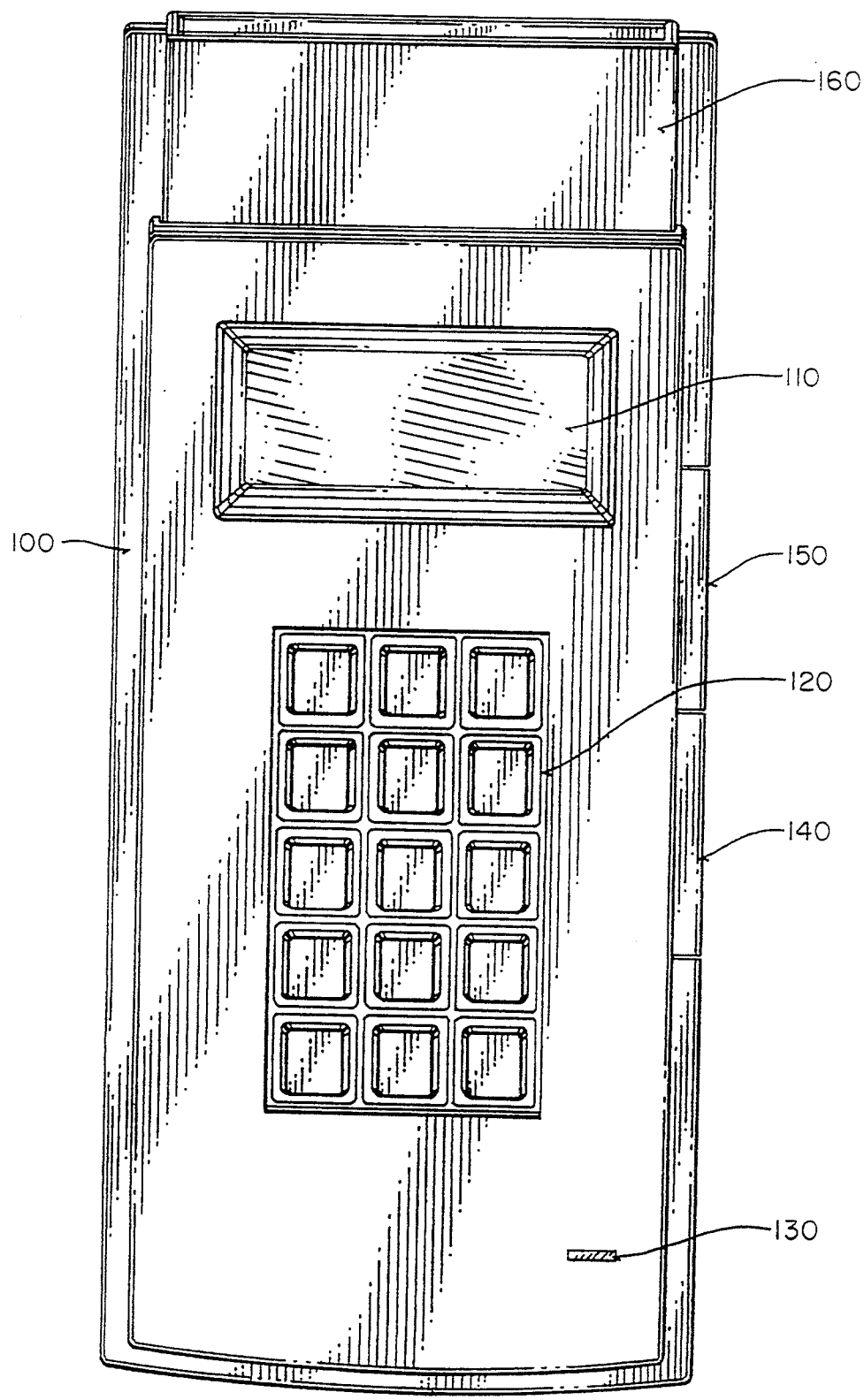
FIG_2

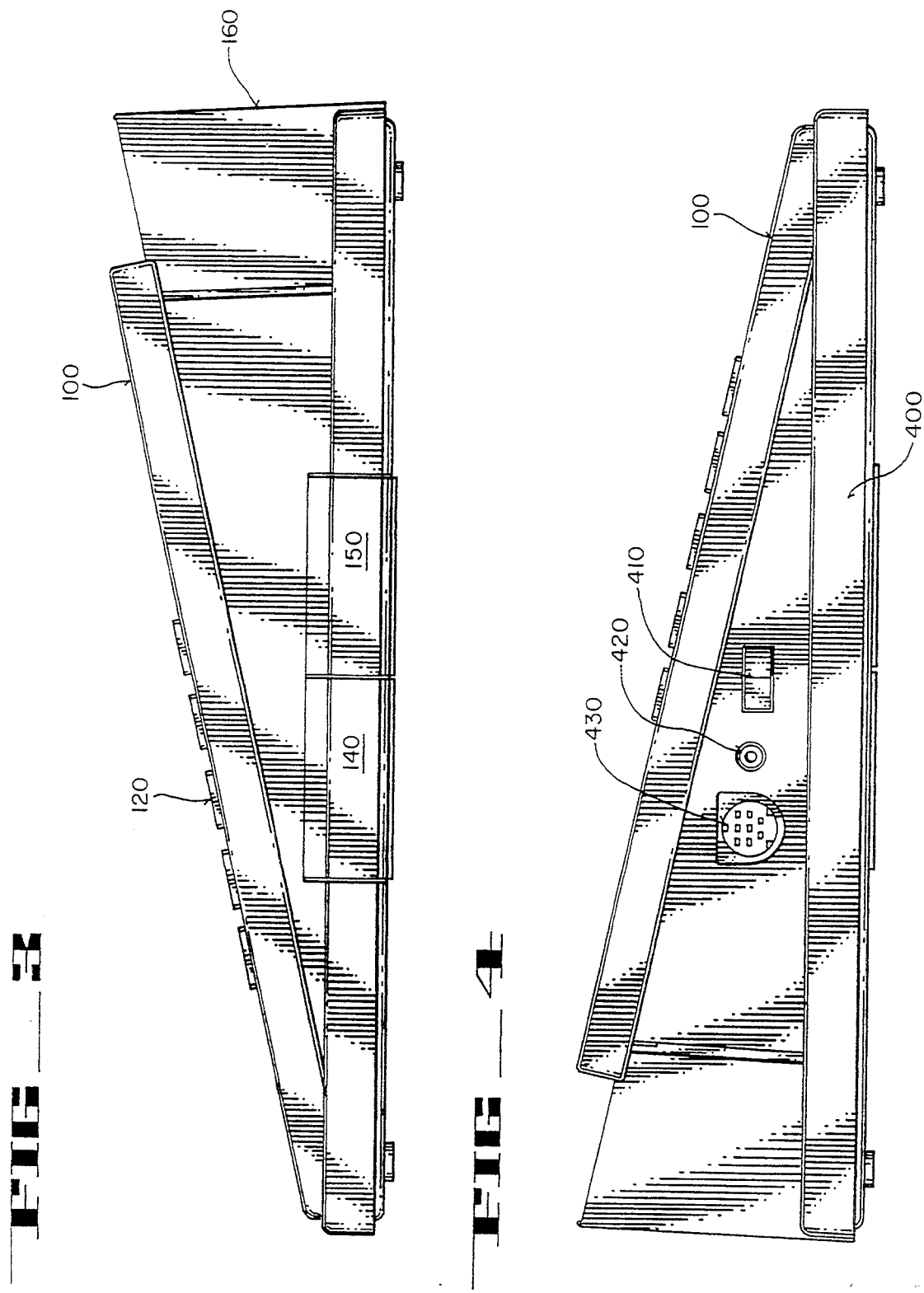

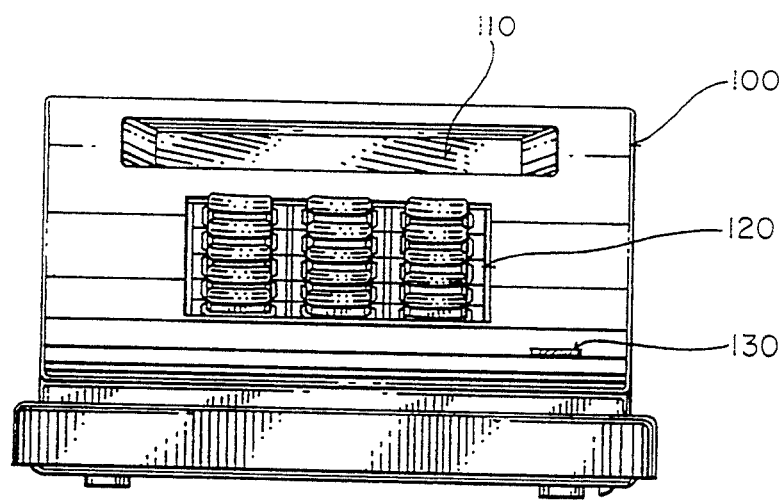
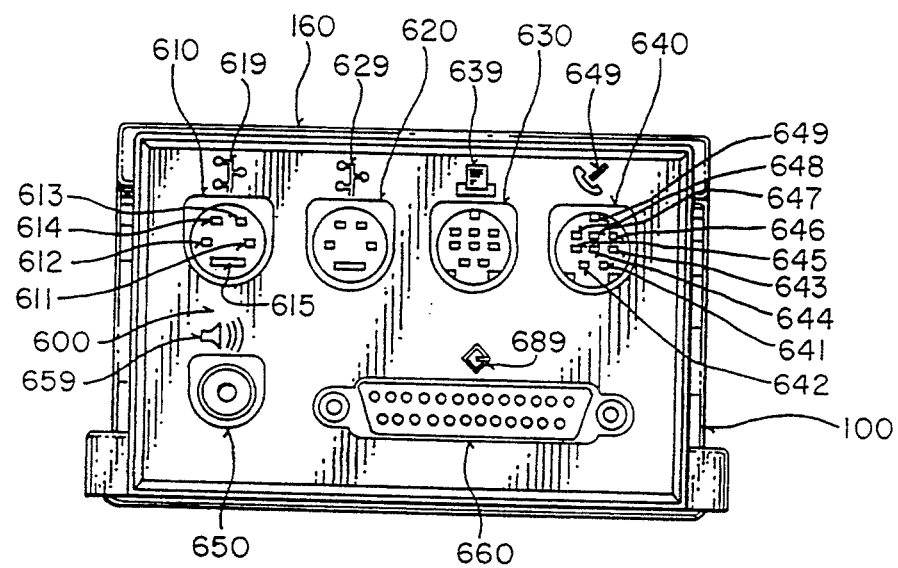

FIG_7
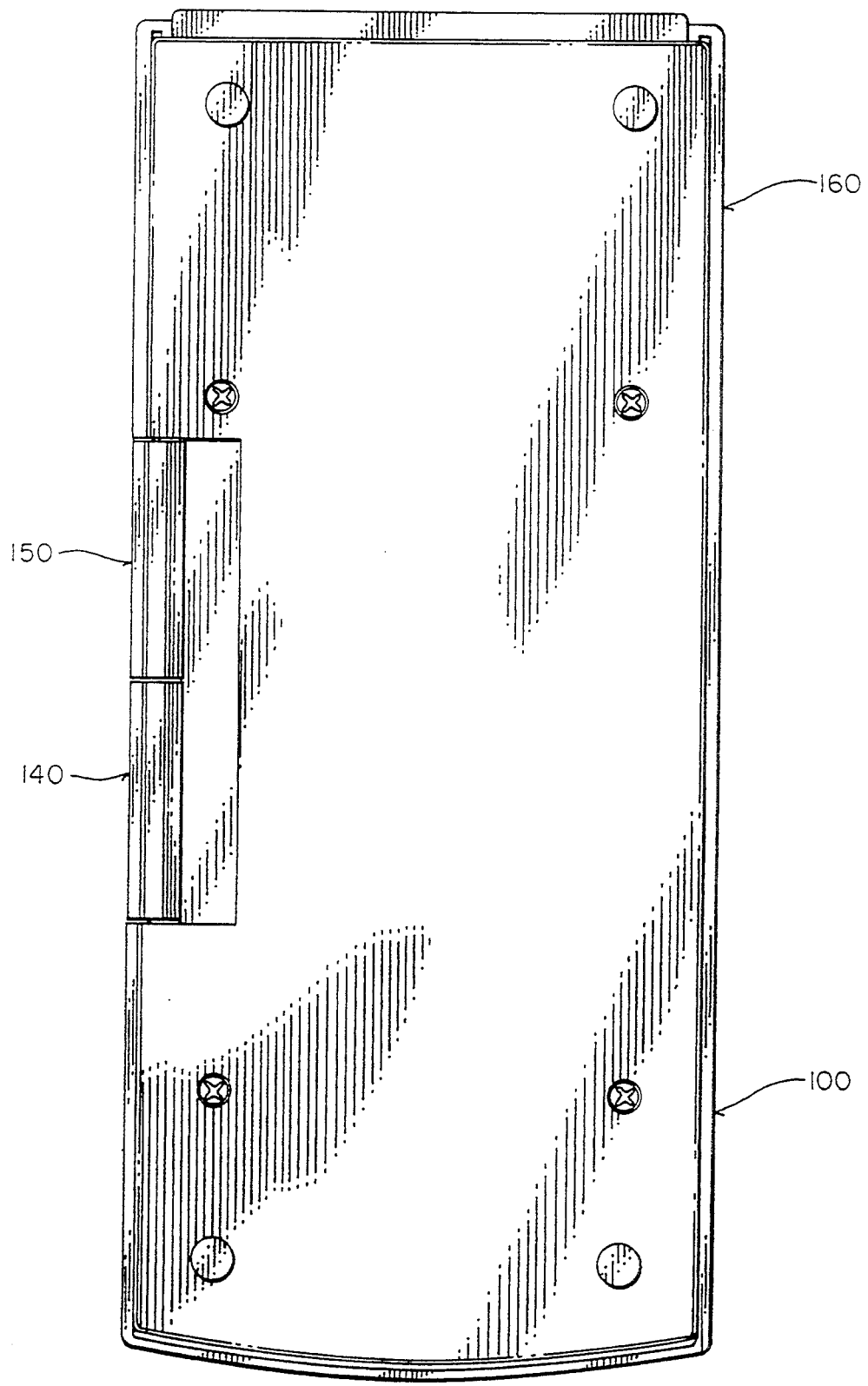

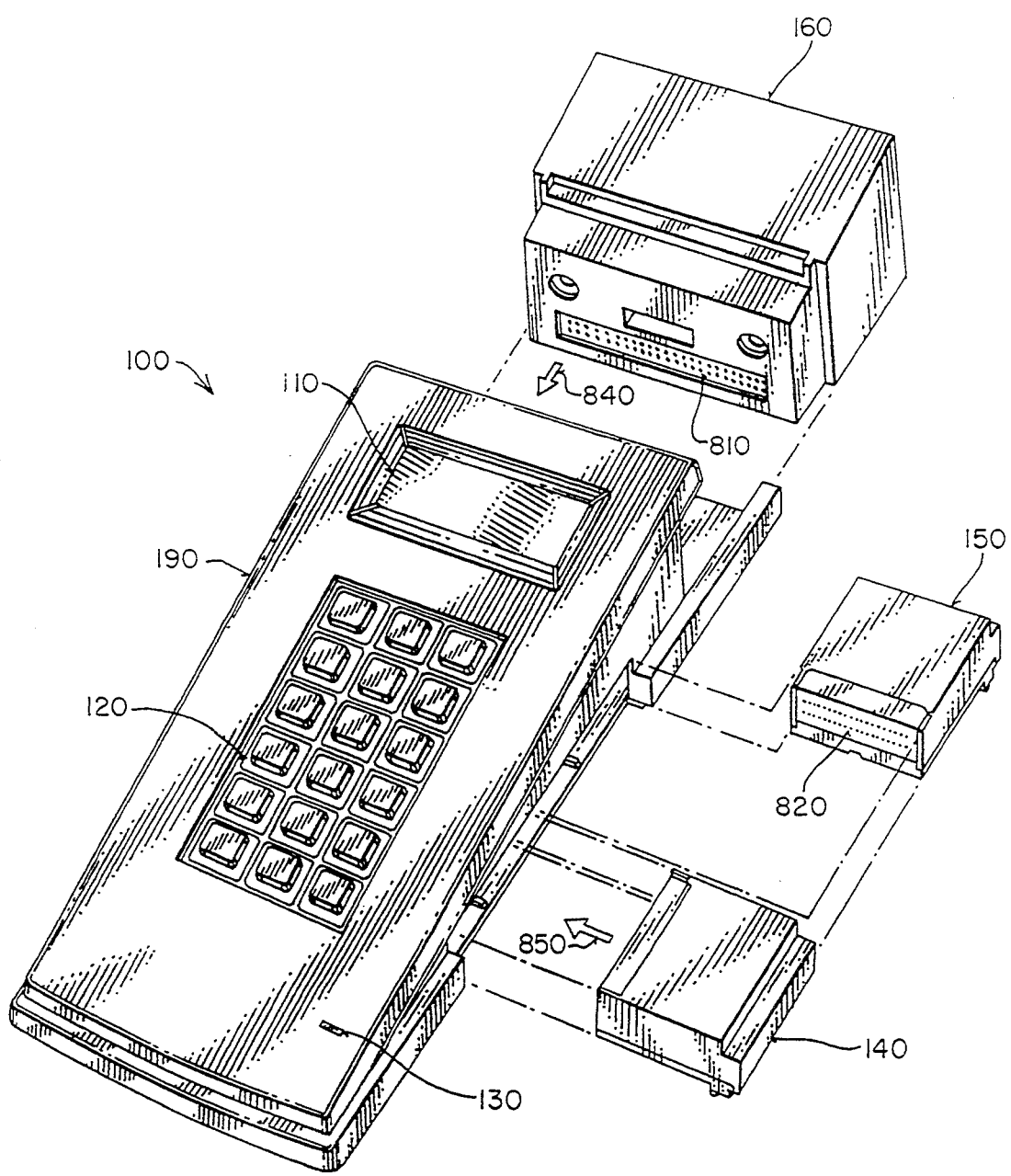
FIG_8

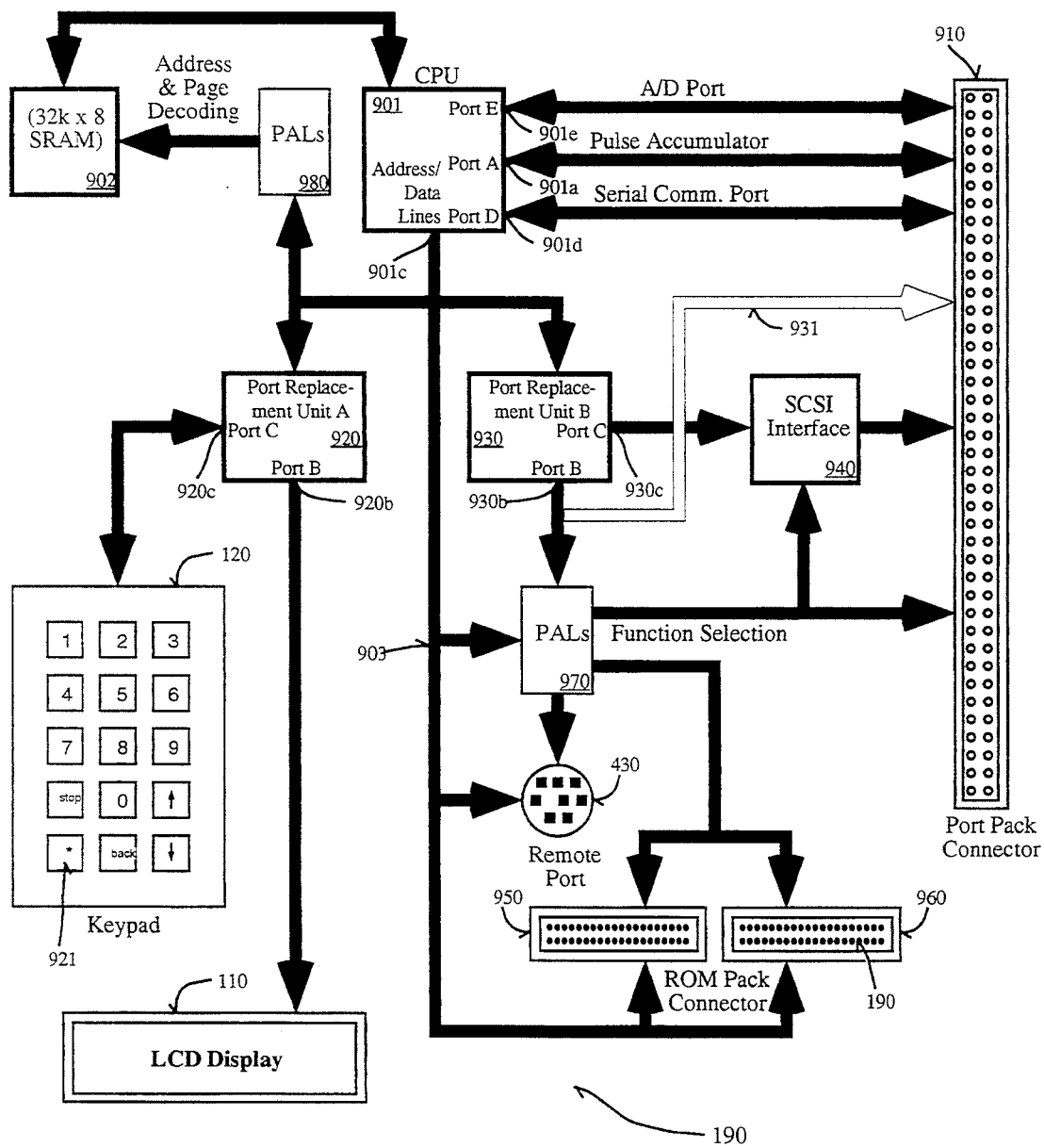
Figure 9 - Diagnostic Tool Base Unit

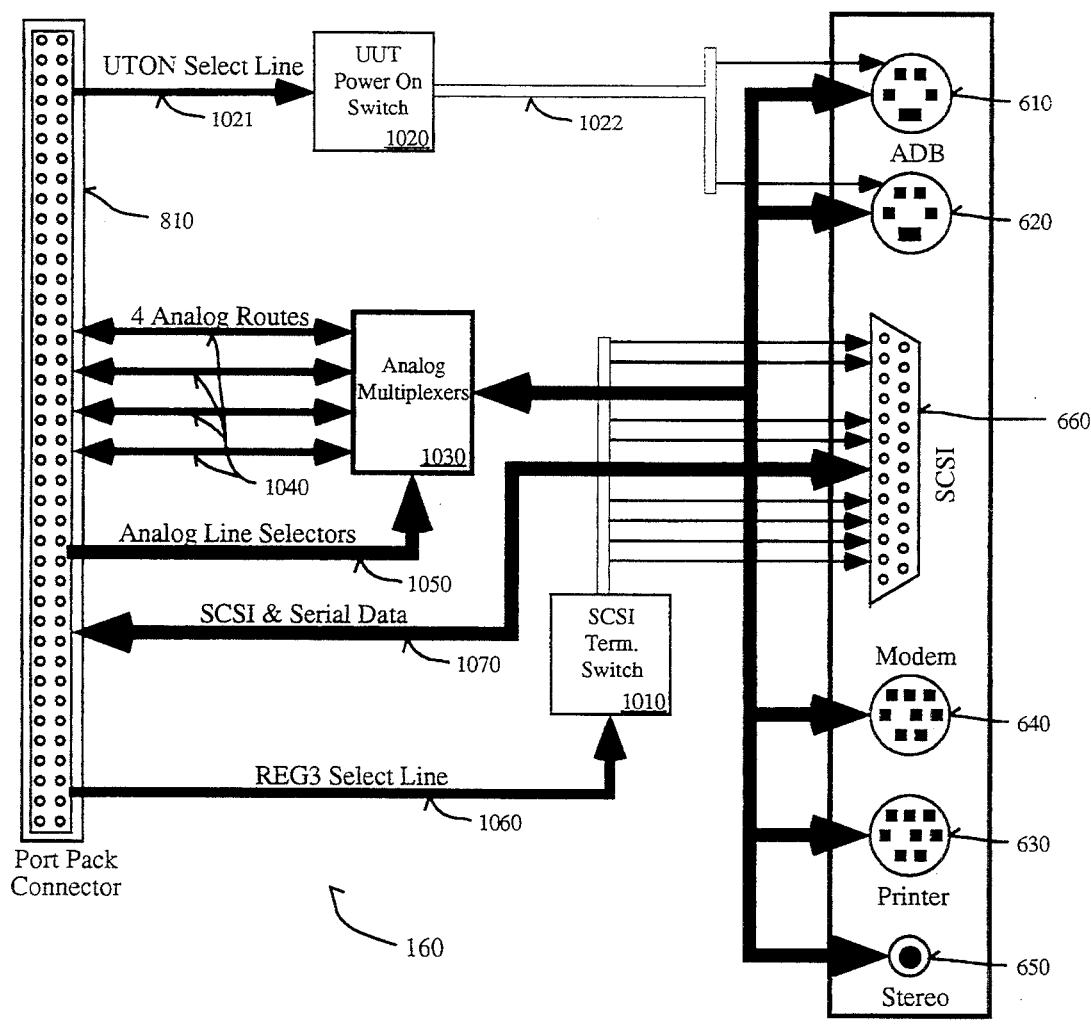
Figure 10 - Peripheral Port Pack

| $4552 | 1501 | always $4552 |
| $0200 | 1502 | block size of device (each block is 512 bytes) |
| $00000006 | 1503 | number of blocks on device (longword) |
| $0001 | 1504 | device type |
| $0001 | 1505 | device ID |
| $0001 | 1506 | |
| $0001 | 1507 | number of driver descriptors |
| $00000004 | 1508 | first block of driver (longword) |
| $0001 | 1509 | driver size in blocks |
| $0001 | 1510 | system type |

Driver Descriptor: rows 1508–1510

1401a

Figure 15 - Driver Descriptor Map

ACTIVE BUS TERMINATION DEVICE

This is a divisional of application Ser. No. 07/771,127, filed Oct. 3, 1991 now U.S. Pat. No. 5,357,519.

BACKGROUND OF THE INVENTION

1. Field of the Invention

The present invention relates to the field of diagnostic methods and apparatuses for computer systems. More specifically, this invention relates to a device and method for diagnosing a faulty computer system without disassembling the system.

2. Description of Related Art

The diagnosis of faulty computer systems, at times, can be a difficult process. For systems which are incapable of powering up and performing a system bootstrap initialization process, determining which components are faulty requires substantial time and effort using a variety of methods. One method of diagnosing a faulty computer system is to remove components in the computer system one by one and replace them with components which are known to work. Such a "trial and error" approach not only requires an on-hand inventory of components which are functional, but also requires that the computer system be disassembled. This type of diagnosis requires substantial effort to disassemble and reassemble the system and does not necessarily identify the underlying defect which caused the failure.

Yet another method for diagnosing a faulty computer system is to couple various types of diagnostic apparatuses to individual components. This process requires some disassembly of the computer system to attach diagnostic probes to the individual components. Depending on the location of individual components, this process may take a lot of time to disassemble the faulty device. This also requires specialized tools to test individual components.

For a system which is able to power up and execute a system bootstrap initialization but does not function properly, diagnosis may be performed using a software-utility. Some types of utility programs may diagnose certain faulty components, but if the faulty components are required to operate the utility, the diagnosis of the system will be impossible. Even though the disassembly of the computer system may not be required to run such a diagnostic program, this program may be limited by the inability to test certain hardware components.

Some computer systems perform a software diagnostic self-test upon a system bootstrap initialization process. This type of routine tests various components in the system prior to operation to ensure that the system is operating properly. One such diagnostic routine is known as the "Test Manager" program which forms pan of the bootstrap initialization procedure of the Macintosh ® brand computer available from Apple Computer, Inc. of Cupertino, Calif. (Macintosh ® is a trademark of Apple Computer, Inc.). This initialization process includes, among other things, initializing versatile interface adaptor (VIA) circuits, serial communication controller (SCC) circuits, floppy disk drive integrated circuit controllers, small computer system interface controller (SCSI) circuits, and sound device circuits coupled to the system. These routines, which are embedded in read-only memory (ROM) contained within the system, require that the system be capable of activating system power and initializing. If the system cannot be initialized, then certain types of tests may not be able to be performed.

Another drawback of prior approaches to diagnosing computer systems is that different computer systems have a variety of interfaces and ports. Each port or interface requires a different connector and/or different circuitry to test these ports or interfaces. For instance, in addition to generic serial and parallel ports such as RS-232 standard ports or SCSI ports, some computer systems may have manufacturer-specific ports such as the Apple Desktop Bus (ADB) brand interface manufactured by Apple Computer, Inc. The wide variety of ports, interfaces and other coupling means for various systems makes it difficult to diagnose the many types of computer systems in the marketplace. Because the parameters of each interface and/or port must be known to the individual diagnosing the computer system, it is difficult for one person to diagnose a variety of machines. In addition, it is helpful if various types of connectors are available for coupling to the various systems for diagnosis. In summary, no single device possesses the necessary characteristics to diagnose various types of computer systems at all levels of operation.

SUMMARY AND OBJECTS OF THE INVENTION

One object of the present invention is to provide a device which can diagnose a computer system incapable of performing a system power up or bootstrap initialization process.

Another object of the present invention is to provide a device which performs nonintrusive diagnostics of a computer system.

Another object of the present invention is to provide a device which is capable of diagnosing various types of computer systems including system-specific connectors and interfaces.

Another object of the present invention is to provide a method and apparatus which facilitates diagnostics of a computer system with a minimal level of system-specific knowledge by a user.

These and other objects of the present invention are provided for by a diagnostic apparatus for testing devices such as computer systems, and computer system peripheral devices such as disk drives or printers. The apparatus comprises a main unit, the main unit having a central processing unit for executing instructions, issuing commands, and receiving data from a first device being tested. In a preferred embodiment, the apparatus comprises a display and keyboard for communicating with a user of the apparatus. The apparatus also has a first peripheral unit coupled to the main unit, the first peripheral unit having ports for interfacing with the first device, the first peripheral unit being interchangeable with a second peripheral unit for interfacing with a second device. The first peripheral unit may, for example, be used for testing one computer system such as a personal computer, and the second peripheral unit may be used for testing a second personal computer, disk drive, or printer. The apparatus also comprises a first non-volatile memory unit coupled to the main unit, the first non-volatile memory unit comprising a first set of tests for the first device. The first non-volatile memory unit is interchangeable with a second non-volatile memory unit comprising a second set of tests for a second device. These units are provided so that the user may test various types of hardware.

These and other objects of the present invention are provided for by a device for terminating a bus. In a preferred embodiment, the termination on a bus, for example a small computer system interface (SCSI) may be desired. The device comprises a first means for activating termination of the bus which, in a preferred embodiment, is a flag in a register. When set, the flag switches on SCSI termination, and when not set (e.g., cleared) there is no termination. The device further comprises a second means coupled to the first means for supplying power, the second means being activated upon activation of the first means. In a preferred embodiment, the second means is a p-channel MOS-FET. The device also has a third means coupled to the second means for limiting voltage received from the second means which is a low dropout voltage regulator. Lastly, the device has a fourth means coupled to the third means for limiting transient voltages on the bus, which prevents the bus from appearing as if any device is coupled to the bus.

These and other objects of the present invention are provided for by a means for remotely entering a diagnostic program in a computer system. This method comprises simulating a first device coupled to the computer system and simulating a driver for the first device coupled to the computer system. The computer system is caused to load the driver and then to call the driver to execute itself in the computer system. The driver contains a jump instruction to the diagnostic program causing the diagnostic program to then execute.

BRIEF DESCRIPTION OF DRAWINGS

The present invention is illustrated by way of example and not limitation in the figures of the accompanying in which like references indicate like elements and in which:

FIGS. 1 through 7 including 6a, show the external physical configuration of the diagnostic apparatus.

FIG. 8 shows a removable port pack and removable ROM packs in a disassembled configuration used in the diagnostic device of the preferred embodiment.

FIG. 9 is a block diagram of the base unit of the diagnostic device.

FIG. 10 is a block diagram of file port pack of the diagnostic device.

FIGS. 13 through 15 show the SCSI device emulation used by the preferred embodiment to enter the Test Manager brand diagnostic program.

DETAILED DESCRIPTION

Figure 6A:
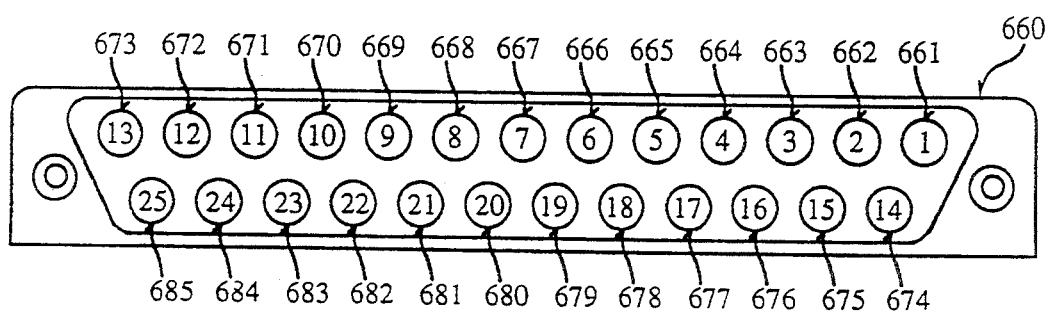

A device and method for diagnosis of computer systems is described. In the following description, for the purposes of explanation, numerous specific details are set forth such as circuitry, signal names, signal lines, and pan numbers are set forth in order to provide a thorough understanding of the invention. It will be obvious, however, to one skilled in the an that the invention may be practiced without these specific details. In other instances, well-known circuits, structures, and techniques have not been shown in detail in order to not unnecessarily obscure the present invention.

Physical Configuration of the Diagnostic Tool

FIG. 1 shows the external physical configuration of the preferred embodiment of the present invention. Diagnostic device 100 is generally used for testing the operation of computer systems, however, it may be used for testing individual components of computer systems such as hard disk drives, printers, monitors, or other peripherals. Diagnostic device 100 comprises several portions which are shown in their assembled and operating configuration in FIG. 1. Diagnostic device 100 comprises a display 110 for presenting information to the user of the device. Display 110 is one of the many liquid crystal displays (LCD's) which are commercially available and well-known to those skilled in the art. Diagnostic device 100 further comprises a keypad 120 for indicating command selections and other information to device 100. Further device 100 comprises a low-power light emitting diode (LED) 130 indicating when battery power in the unit is becoming depleted. In order to provide the utmost flexibility, device 100 comprises modules 140, 150, and 160 which are all removable from device 100 and interchangeable with other modules. 140 and 150 are removable "ROM packs" which provide different tests and different operating modes for the various computer systems or computer peripherals (hereinafter units under test or UUT's) which may be tested by device 100. 160 is also a removable module and is known as a "port pack." Port pack 160 provides computer system ports for the various types of ports which may be present on a system being tested. ROM packs 140 and 150 and port pack 160 will be discussed in more detail below.

FIG. 4 shows one side 400 of device 100. Side 400 of device 100 comprises a power switch 410 which is a single pole, single throw (SPST) rocker switch which is used to activate power to device 100. Further, device 100 comprises an adaptor plug 420 which is a miniature dual conductor plug used for supplying 5 volt power to unit 100 via an integrated power supply adaptor cable. Diagnostic device 100 may also be powered by an internal battery when not coupled to a power supply via plug 420. In addition, as shown on side 400 of FIG. 4, device 100 comprises a female serial port 430 which is used for coupling device 100 to a modem (modulator/demodulator) for communication over telephone lines. This provides the capability for device 100 to communicate with other devices 100 or UUT's which can be remotely tested. Connector 430 is a mini 8-pin serial port connector which conforms to EIA standard RS-232 signal conventions. The signals and pins on connector 430 are described in more detail in *Guide to the Macintosh Family Hardware*, Second Edition by Apple Computer, Inc. available from Addison-Wesley Publishing Company, Inc. (copyright 1990) (hereinafter "Hardware Guide") at pages 357-374. Various ports and detailed connections to port 430 will be discussed in more detail below.

Removable ROM Packs

For the greatest flexibility in testing various types of computer systems and other devices with diagnostic tool 100, ROM packs 140 and 150 and port pack 160 are provided which are all removable from main unit 190 of device 100 as shown in FIG. 8. These packs may be replaced with other packs which have different ports and/or different of tests. As is shown in FIG. 8, port pack 160 may be coupled to main unit 190 via connector 810. Connector 810, in the preferred embodiment, is a Fujitsu FCN215Q080:G/O, 80-pin. male connector. A detailed description of the signals and the lines on connector 810 will be discussed below. 810 provides an interface with main unit 190 of device 100 so that communication with various peripheral ports on pack 160 may be accomplished. Port pack 160 may be coupled to main unit 190 by affixing 160 to 190 in the direction shown as 840 on FIG. 8. This mates connector 810 with a corresponding female connector on main unit 190 (not shown). In addition, 100 comprises removable ROM packs 140 and 150 which comprise non-volatile test routines and other device or system-specific diagnostic programs. As is shown in FIG. 8, each module such as 150 comprises a connector such as 820 which is mated to the main unit 190 to provide access to the test routines embedded in the non-volatile memory of each ROM pack 140 or 150. Each ROM pack such as 140 and 150 may be coupled to main unit 190 via a 40-pin Fujitsu FCN215Q040-G/O male connector which mates with a corresponding female connector on main unit 190 (not shown). A ROM pack such as 140 may be inserted into main unit 190 in a direction shown by arrow 850 in FIG. 8 to provide communication between main unit 190 and ROM packs 140 and 150.

Removable Port Pack

A more detailed view of the rear 600 of port pack 160 is shown in FIG. 6. 600 of 160 shows various ports contained in one port pack 160 which is designed for testing various models of the Macintosh brand computer system family manufactured by Apple Computer, Inc. of Cupertino, Calif. Port pack 160 is used for testing the models Macintosh SE, SE/30, and the Macintosh II brand family of computers including the IIx, IIcx, among others. It can be appreciated by one skilled in the an, however, that a port pack other than 160 may be plugged into base unit 190 of diagnostic device 100 in order to provide a different set of ports. In the preferred embodiment, port pack 160 has six ports. Base unit 190 may accommodate any number of ports depending on the configuration of the port pack. It will be appreciated by one skilled in the art, that any number of ports may be present on a peripheral port pack in various embodiments of the present invention. A detailed description of the ports available on port pack 160 of device 100 shown in FIG. 6 will now be discussed.

As is shown in FIG. 6, side 600 of port pack 160 comprises several ports which interface with Macintosh brand computer systems. Port pack 160 comprises two Apple Desktop Bus (ADB) brand connectors 610 and 620, two miniature 8-pin EIA RS-424 standard serial connectors 630 and 640, a two-conductor miniature audio connector 650 for coupling to audio ports, and a 25-pin female DB25 SCSI connector 650 for coupling to devices such as SCSI disk drives and disk drive ports on computer systems. ADB ports 610 and 620 are used for coupling with ADB brand ports on Macintosh computer systems for communicating various information to and from the computer via devices such as keyboards, trackballs, or mice. The pin assignments for 611 through 614 are shown in FIG. 6 and the corresponding signals are described with reference to Table 1 below.

TABLE 1

Signal Assignments for ADB Connector 610

| Pin Number | Signal Name | Signal Description |
|---|---|---|
| 611 | ADB | Bidirectional data bus used for input and output. It is an open-collector signal pulled up to +5 V through a 470 Ω resistor on an Apple Macintosh brand computers main logic board. |
| 612 | POWER.ON | On the Macintosh II family, a key on the keyboard momentarily grounds this pin to pin 614 to switch on the power supply. On other Apple Macintosh brand computers this pin is not connected. |
| 613 | +5 V | +5 volts. |
| 614 | GND | Ground. |

A more detailed discussion of the ADB signals and devices used in the preferred embodiment is discussed in *Hardware Guide* at pages 287-326. A more detailed discussion of signals issued by device 100 for performing diagnostics of a computer system is discussed below. The pin assignments for connector 620 are the same as those used on connector 610. 610 are 620 are indicated by their corresponding labels 619 and shown in FIG. 6, the ADB icons. Further, each of the connectors has a key 615 associated with it such as shown with reference to 610, to prevent improper insertion of cables into connectors 610 or 620.

Port pack 160 further comprises two serial ports 630 and 640. Serial ports 630 and 640 are used for coupling to a printer port or a modem port on a system as indicated by the appropriate labels 639 or 649. As discussed above, each of the serial ports in the preferred embodiment and on port pack 160 conform to the EIA RS-422 standard signal conventions which are described in more detail in *Hardware Guide* at pages 357-374. The pin assignments for serial port 640 is described with reference to Table 2 below. The signal assignments for the pins on 630 are the same.

TABLE 2

Signal Assignments for Mini 8-pin Serial Port Connector 640

| Pin Number | Signal Name | Signal Description |
|---|---|---|
| 641 | HSKo | Handshake ouput. Driven inverted. Voh = 3.6 V; Vol = −3.6 V; R1 = 450 Ω |
| 642 | HSKi | Handshake input or external clock. Received uninverted. Vih = 0.2 V; Vil = −0.2 V; Ri = 12K Ω |
| 643 | T × D− | Transmit data (inverted). Driven inverted or tristated depending on the operation mode. Voh = 3.6 V; Vol = −3.6 V; R1 = 450 Ω |
| 644 | GND | Signal ground. Connected to logic and chassis ground. |
| 645 | R × D− | Receive data (inverted). Vih = 0.2 V; Vil = −0.2 V; Ri = 12K Ω |
| 646 | T × D+ | Transmit data. Driven uninverted or tristated depending on the operation mode. Voh = 3.6 V; Vol = −3.6 V; R1 = 450 Ω |
| 647 | GPi | General-purpose input. Vih = 0.2 V; Vil = −0.2 V; Ri = 12K Ω |
| 648 | R × D+ | Receive data. Received uninverted. Vih = 0.2 V; Vil = −0.2 V; Ri = 12K Ω |

The two remaining ports on port pack 160 of the preferred embodiment are shown as 650 and 660 in FIG. 6. 650 is a standard 2-conductor female monaural audio miniature jack used for diagnosing the sound capabilities of the device being tested. This is indicated by the sound label icon 659 above the sound jack. The processing of the signals received from sound jack 650 is discussed below.

Lastly, 160 comprises SCSI connector 660 which is a standard 25-pin female DB25 SCSI connector which is discussed in more detail in *Hardware Guide* at pages 375-396. SCSI connector 660 is labelled by icon 669 as shown in FIG. 6. The circuitry coupled in main unit 190 to port pack 160 and thus to connector 660 is the discussed in more detail below. Pin outs on connector 660 are assigned as shown in FIG. 6a with reference to Table 3 below.

TABLE 3

Signal Assignments for SCSI Connector 660

| Pin Number | Signal Name | Signal Description |
|---|---|---|
| 661 | /REQ | Request for a REQ/ACK data transfer handshake |
| 662 | /MSG | Indicates the message phase |
| 663 | /I/O | Controls the direction of data movement |
| 664 | /RST | SCSI data bus reset |
| 665 | /ACK | Acknowledge for a REQ/ACK data transfer handshake |
| 666 | /BSY | Indicates whether SCSI data bus is busy |
| 667 | GND | Ground |
| 668 | /DB0 | Bit 0 of SCSI data bus |
| 669 | GND | Ground |
| 670 | /DB3 | Bit 3 of SCSI data bus |
| 671 | /DB5 | Bit 5 of SCSI data bus |
| 672 | /DB6 | Bit 6 of SCSI data bus |
| 673 | /DB7 | Bit 7 of SCSI data bus |
| 674 | GND | Ground |
| 675 | /C/D | Indicates whether control or data is on the SCSI bus |
| 676 | GND | Ground |
| 677 | /ATN | Indicates an attention condition |
| 679 | /SEL | Selects a target or an initiator |
| 680 | /DBP | Parity bit for SCSI data bus |
| 681 | /DB1 | Bit 1 of SCSI data bus |
| 682 | /DB2 | Bit 2 of SCSI data bus |
| 683 | /DB4 | Bit 4 of SCSI data bus |
| 684 | GND | Ground |
| 685 | TPWR | +5 volts terminator power |

Circuitry of the Diagnostic Tool

A block diagram of the main unit of diagnostic apparatus 190 is shown with reference to FIG. 9. Central processing unit 901 of diagnostic tool 100 is a 68HC11E9 microcontroller manufactured by Motorola, Inc. of Schaumburg, Ill. The HC11E9 version of the microcontroller comprises the following features which are useful for implementing certain features of the preferred embodiment:

12 kilobytes of internal programmable read-only memory (PROM);

512 bytes of internal read-only memory (RAM);

512 bytes of internal electrically erasable programmable read-only memory (EEPROM);

a serial communication interface with 32 selectable baud rates;

a serial peripheral interface;

an 8-channel, 8-bit analog to digital (A/D) converter; and an 8-bit pulse accumulator/generator system.

A detailed description of the M68HC11E9 CPU 901 used in the preferred embodiment may be found in the publication M68HC11 Reference Manual, Revision 1, by Motorola, Inc. of Schaumburg, Ill. (1990). CPU 901 is docked by a 9.8304 MHz crystal which internally divides to a 2.45676 MHz "machine cycle" timing reference for CPU 901 and external devices. CPU 901 is set into a "special bootstap" mode for updating and testing its internal EEPROM. During the normal operation of the preferred embodiment, CPU 901 is run in its expanded multiplex mode wherein dedicated ports B and C on CPU 901 are converted to 16-bit multiplex address and 8-bit data lines AD0 through A/D7 and A8 through A15.

In addition to the onboard non-volatile memory and RAM available to CPU 901, diagnostic base unit 190 further comprises a 32-kilobit by 8-bit static random access memory (SRAM) 902 which is coupled to CPU 901. Memory 902, in a preferred embodiment is a 32-kilobit by 8-bit SRAM, pan No. 60L256 manufactured by Motorola, Inc. of Schaumburg, Ill. SRAM 902 is for storing additional information needed by CPU 901, such as a buffer area for various ports and for use as a scratch pad memory. As is shown in FIG. 9, pulse accumulator circuitry of CPU 901 is coupled to port pack connector 910 via port A 901a to provide communication with various circuitry contained in the peripheral port pack 160 as shown in FIG. 8 via connector 810. Port A 901a doubles as the pulse accumulator/timer circuit and I/O lines for CPU 901. These lines provide the input capture and output capture compare functions for time signal measurements and generation to and from base unit 190. Port A 901a is used for handling the UUT's input/output (I/O) signals. PAL's 980 provide the necessary address decoding to access SRAM 902.

Further, port E 901e of CPU 901 is coupled to connector 910 which is used as an analog to digital (A/D) port. Port E 901e is used for measuring various voltages from the UUT including the battery and the power supply on the UUT. These are measured via channels 1, 2, 3, 4, and 5 of the A/D converter internal to CPU 901 coupled to port E 901e. Certain input signals are fed through voltage divider circuits and then through high impedance op amps. The divider and op amp circuit are used to measure voltages up to twice the +5 volt reference provided at $V_{RH}$ such as for the sound connections and certain serial port lines. This increases the gain of certain input signals prior to digitizing by CPU 901. The low voltage reference $V_{LH}$ for the A/D converter is tied to ground.

Address/data lines 901c of CPU 901 are coupled to two port replacement units 920 and 930 which, in the CPU 901's expanded mode, allow additional ports to be made available to CPU 901. When operating CPU 901 in the expanded mode ports B and C of the 68HC11 processor are reconfigured to operate as multiplexed address/data lines A/D0 through A/D7 and A8 through A15. Of course, it will be appreciated by one skilled in the art, that other microcontrollers which do not operate in this manner may not need port replacement units such as 920 and 930. Port replacement unit A 920 is used for controlling keypad 120 and LCD display 110 of diagnostic base unit 190. Address/data lines of port 901c are further coupled to a second pot replacement unit 930. 930 is coupled to a SCSI interface 940 which is a standard 53C80 SCSI interface integrated circuit manufactured by NCR Corporation for providing SCSI transfers to and from port pack 160 as shown in FIG. 1.

Address/data lines 903 of CPU 901 are also coupled to ROM pack connectors 950 and 960 which are standard 40-pin CN215J040-G/O female connectors manufactured by Fujitsu Corporation. These provide the coupling between the ROM packs 140 and 150 and CPU 901 for hardware specific diagnostics. Communication with ROM packs 140 and 150 is provided via port replacement unit B 930 and PAL's 970. PAL's 970 are also coupled to remote port 430 for serial communications to perform remote diagnosis of peripherals or computers over telephone lines via modem.

When CPU 901 is operated in its multiplexed or expanded mode, general purpose I/O ports B and C of CPU 901 configured to operate as multiplexed address-/data lines. Port replacement unit A 920 is coupled to the address/data multiplex lines of port 901c on CPU 901 in order to provide communication between keypad 120, LCD display 110 and unit 190. Address lines A8 through A11 are processed through a PAL to provide the necessary decoding to generate a chip select signal (/CS) in order to indicate which of the two port replacement units is being accessed. Port replacement unit 920 enables communication between keypad 120, LCD display 110, and CPU 901. Port B 920b of port replacement unit 920 is used for communication with LCD display 110, except for 3 bits of port B which are used for controlling various functions in port pack 160. The 4 most significant bits of the control information passed through port B are used for controlling display 110. In the preferred embodiment, display 110 is an LM2433A4C16B dot matrix 4 line by 16 character liquid crystal display module available from Densitron International Corporation. Display 110 requires eight bits of information to generate a character. 4 bits (a nibble) of each datum contained in the control register of port B is written individually to the memory mapped region for LCD display 110 at a time. The high order nibble data is first sent for the display, followed by the low order nibble data in sequential order. When LCD display 110 receives the high nibble of an instruction or display character, it latches the data until it receives the low order nibble data and then the data (character or instruction) becomes available for display.

The remaining four bits of the port B control register 920b of port replacement unit A 920 are used for various control functions. Bit 0 (the least significant bit) of port B 920b is used to control the command/display mode for LCD display 110. Bit 1 is used to control the read and write direction of LCD display 110. The two remaining bits of port B 920b are used for controlling the UUT. Bit 2 is used to initiate a "power on" sequence in the Macintosh II brand family of computers available from Apple Computer, Inc. of Cupertino, Calif. via port pack unit 160 as discussed with reference to Table 1 above. Bit 3 of port B 920b of port replacement unit A 920 is used to supply power to port pack connector 910 during data transfers as a means of prolonging the battery life of diagnostic tool 100.

Port C 920c of port replacement unit A 920 is used for receiving information from keypad 120. Keypad 120, in one embodiment, is a 15-key 9-pin custom silicon rubber keypad. 120 may be one of any number of keypads which are commercially available. The five most significant bits of the keypad memory map register are used for receiving data from keypad 120 in a manner well-known by those skilled in the an. The three least significant bits of the control register are used for enabling-/disabling the columns on the keypad for receiving data input from keypad 120. Key 921 on keypad 120 (the "*" or "command" key) is used for generating an interrupt request to CPU 901 that a coined is being issued through keypad 120. This is coupled to the maskable interrupt line of CPU 901 to indicate the issuance of a command.

A second port replacement unit B 930 shown in FIG. 9 is used for providing communication with ROM packs 140 and 150, and port pack 160 in the preferred embodiment. When port replacement B 930 is selected via the chip select signal, it is used for communicating with SCSI interface 940, and ROM packs 140 and 150. It is also used for providing control to a UUT serial port 901d and for communication over remote port 430. It can be appreciated by one skilled in the art, however, that any number of computer systems and/or ports may be used depending on the configuration of the port pack, such as 160, which is coupled to diagnostic base unit 190. Port C 930c of port replacement unit B 930 provides communication with SCSI controller 940, which is, in turn, coupled to port pack 160 via connector 910. This provides communication with SCSI devices coupled to a port such as 660 shown in FIG. 6. Port C 930c of port replacement unit B 930 acts as a bidirectional interface to controller chip 940, but also provides a serial communications port selector line for communication with remote port 430. In addition, a sleep select pin (/TIRED) is coupled to port C which is used for putting diagnostic apparatus 100 into a mode in which the minimum power is consumed (known as a "sleep" mode). Power consumption is minimized by deactivating the display, and stopping execution of all functions except monitoring keyboard interrupts in a manner well-known to those skilled in the art. SCSI data is memory mapped into RAM area 902 providing bidirectional data transfers between port replacement unit B 930 and SCSI communications chip 940 for reading and writing data between UUT's. Signals for controlling SCSI transfers between communications chip 940 and port replacement unit 930 are well-known to those skilled in the art and are used for SCSI transfers via 940 in the preferred embodiment. One function provided by the preferred embodiment is the use of a software-controllable SCSI termination of the UUT for simulating the presence of device(s) coupled to the UUT. This termination is activated by setting a bit in a control register of port B. Diagnostic base unit 190 can also simulate a SCSI device to a UUT by simulating the presence of partitions, and file allocation tables for performing other types of testing.

Port B 930b of port replacement unit B 930 is used as general purpose port for external ROM and RAM page control, as well as ROM pack and serial EEPROM selectors. Address lines A12 through A15 on port 901c of CPU 901 are remapped using PAL's 970 to provide the appropriate memory mapping in CPU 901's random access memory. Each individual ROM pack is selected via a select bit contained within the control register for the ROM packs. This selects which connector 950 or 960 is accessed for data, to access tests to residing in ROM pack 140 or ROM pack 150. Each ROM pack such as 140 or 150 may individually contain hardware specific tests.

Diagnostic base unit 190 lastly comprises a serial communication port which is coupled to port D 901d of CPU 901. Three separate serial communication lines are provided through port 901d which are activated by two lines on port B 930b of port replacement unit 930. When both of the control bits are cleared, the serial communications port 901d is put into a loop back test mode. Either one of these signals being activated enables one of two sets of serial communication transmit and receive lines. Both bits being set enables a third set of transmit and receive lines. Port D 901d of CPU 901 is coupled through an RS-232 driver receiver chip (Motorola part No. MC145407—not shown) which is then coupled to port pack connector 910. The third set of serial transmit and receive lines are used for communication over remote port 430 for remote UUT testing. The first set of transmit and receive lines are the primary communication means by which the preferred embodiment communicates with software diagnostics embedded in certain types of computer systems, such as the Macintosh brand family of computers. These embedded software diagnostics are collectively known as the "Test Manager." The second set of transmit and receive lines are used for the loop back communication port signals for serial printer ports used in the Macintosh SE and Macintosh II brand family of personal computers.

Standard RS-232 signals are used by diagnostic device 190 for communication with UUT's. However, computer systems such as the Macintosh family of personal computers are capable of using EIA RS-422 hardware protocols which are currently unused by the communications ports directly. The unused lines of the RS-422 lines are selectively sampled using the A/D multiplexers on port pack 160 which, as discussed in more detail below, are connected to port E 901e on CPU 901 via port pack connector 910. A detailed description of one peripheral port pack 160 which may be coupled to diagnostic base unit 190 in one embodiment will now be discussed in more detail with reference to FIG. 10.

Circuitry of the Port Pack

A block diagram of peripheral port pack 160 which may be used in one embodiment of the present invention is shown and discussed with reference to FIG. 10. As was discussed with reference to FIG. 6 above, port pack 160 comprises a series of ports 610 through 660 which are coupled via connector 810 to diagnostic base unit 190 in order to test specific types of UUT's. Peripheral port pack 160 has an FCN215Q080-G/O 80-pin male connector 810 manufactured by Fujitsu, Inc. which mates with connector 910 on base unit 190. A control register of CPU 901 is used to select, via analog multiplexer 1030 shown in FIG. 10, analog signal channels for measurement. Analog multiplexers 1030 are controlled via analog line selectors 1050 which are coupled to port A 901a of CPU 901. Another signal line coupled to port A 901a on CPU 901 is used for enabling SCSI termination. This is coupled via line 1060 from connector 810 to termination circuitry 1010.

In the preferred embodiment, analog multiplexers 1030 comprise four 74HC4051's available from Motorola, Inc. The selection of each analog MUX 1030 enables any or all of lines 1040 for conversion and measurement of voltage values by base unit 190. Also, SCSI and serial data lines 1070 from port pack 160 are coupled to connector 810 for communication with the serial and SCSI circuitry within base unit 190. An additional feature provided by port pack 160 is UTON select line 1021. When activated, this line activates power to certain types of UUT's. UTON select line 1021 is coupled to circuitry 1020 to momentarily ground pins 612 and 614 on connectors 610 and 620 in order to initiate a remote power up of the UUT as discussed with reference to Table 1 above. For other types of UUT's not having such a desion, the user must activate power manually.

For sampling various voltage levels on connectors 610 and 620 coupled to the UUT, pins 611 and 614 are coupled through analog multiplexers 1030 to connector 810. In addition, for communicating with the UUT, connectors 610 and 620 are coupled to lines 1070 and then to connector 810. Communication is thereby provided between the UUT via connectors 610 and 620 and diagnostic base unit 190 for performing various tasks. Communication via ports 610 and 620 is described in more detail with reference to *Hardware Guide* at pages 287–326.

Serial and SCSI communication is performed with the UUT through connectors 630, 640, and 660 is accomplished via the remaining lines 1070 coupled to connector 810. Sampling of voltages on these connectors is also provided in a similar manner as discussed with regard to connectors 610 and 620 via analog MUX's 1030 across lines 1040. Sound capabilities of the UUT, in certain systems, may also be tested in this manner. Other analog voltages, as may be appreciated by one skilled in the an, may be sampled in similar manners.

Software Contollable SCSI Bus Termination

Figure 11:
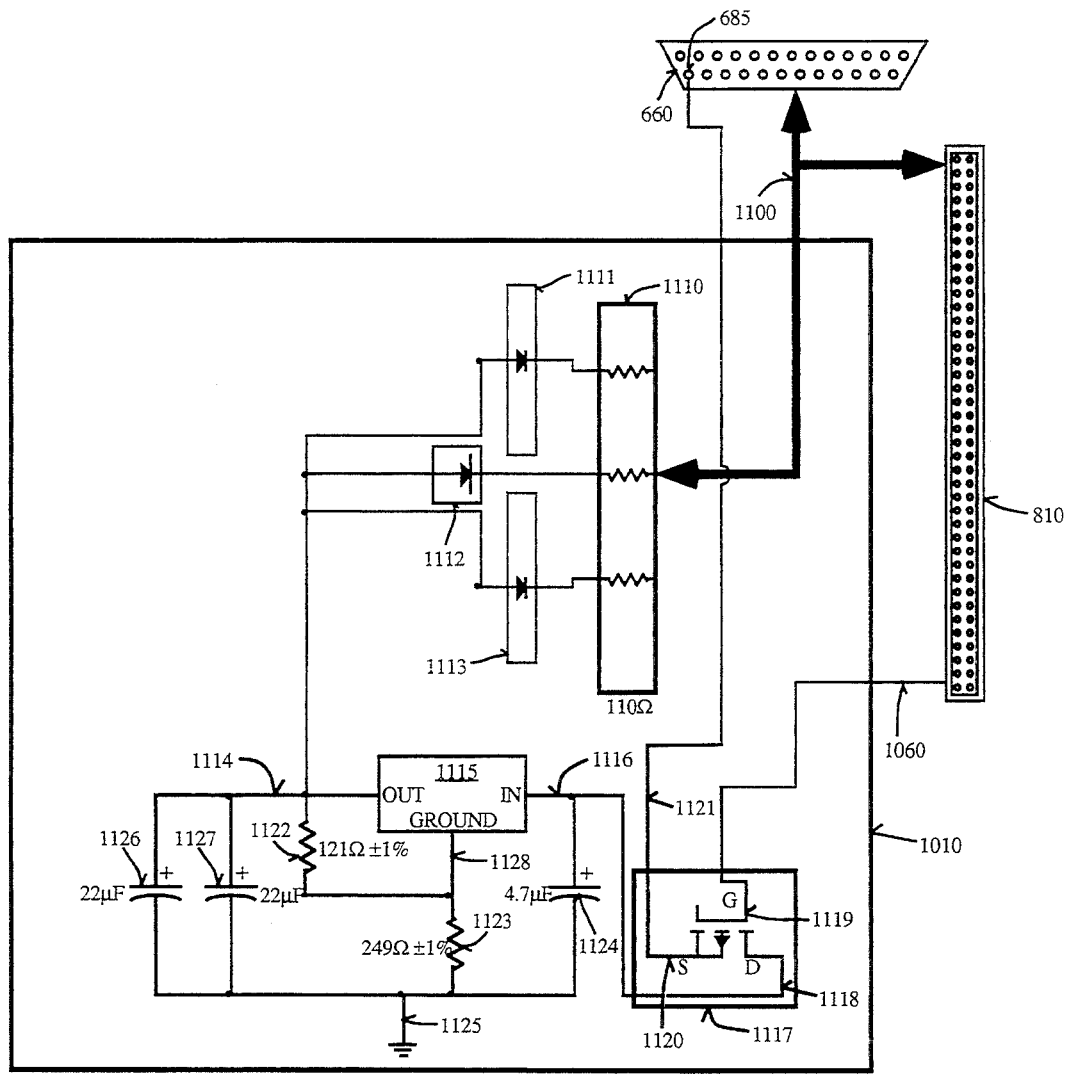
FIG. 11 is a schematic of the software controllable SCSI termination apparatus used by the diagnostic device.

A detailed description of the software controllable SCSI termination circuitry 1010 of the preferred embodiment will now be discussed with reference to FIG. 11. The lines coupled from connector 810 to SCSI connector 660 are routed through 1010 for providing the bus termination. Five volts is received on line 1121 from pin 685 on connector 660 to circuitry 1010. One signal line, REG3 1060 from base unit 190, is provided which activates termination. The remaining SCSI lines 1100 from connector 660 are coupled to the 110 ohm resistors of resistor packs 1110, and resistor pack 1110 is coupled to the cathode on diodes in either of diode packs 1111, 1112, or 1113. The anodes of all the diodes in diode packs 1111, 1112 and 1113 are tied together and connected to an output line 1114 of the low drop out positive adjustable voltage regulator 1115. Voltage from 1117 is fixed by resistors 1122 (121Ω) and 1123 (249Ω) which are coupled to ground on 1128 on 1115 and the output 1114 through a series of capacitors (1126 and 1172 and 1124) tied to ground 1125. The input 1116 of device 1115 is coupled to the drain 1118 of a dual P-channel enhancement MOS-FET 1117. The source 1120 of 1117 is coupled to the, termination power line 1121 (which carries +5 volts) of the UUT (pin 685 on connector 660). Gate 1119 of MOS-FET 1117 is coupled to signal line 1060 coupled to a register in base unit 190 received from for activating SCSI bus termination. When this bit is set to a logic 0, a negative voltage is created at gate 1119 of 1117 effectively sourcing +5 volts from pin 685 (termination power) to 1116 on 1115. 1115 steps down the voltage to 3.8 volts which is supplied to diode packs 1111, 1112, and 1113. Diode packs 1111, 1112, and 1113 drop the voltage down another one volt to provide 2.8 volts to resistor pack 1110. The 2.8 volts with 250 mA limiting resistors is provided to the remaining SCSI lines 1100 and meets the proper voltage and current specifications for SCSI termination of the bus.

On the other hand, when a logic "1" is present on signal line 1060, the voltage at gate 1119 of 1117 is equalized, and thus removing SCSI bus termination from SCSI signal lines 1100. No voltage is provided from drain 1118 of device 1117 to 1116. Each of the resistors in resistor pack 1110 appears as an individual open circuit to SCSI connector 660. SCSI termination is thus effectively removed. In summary, an active signal over line 1060 causes 1010 to deactivate SCSI bus termination on lines 1100, and a logic 0 received over line 1060 causes 1010 to activate SCSI bus termination on lines 1100.

Testing UUT's

The testing of UUT's coupled to diagnostic tool 100 via port pack 160 in the preferred embodiment is accomplished via a sequence of routines embedded in ROM packs 140 and 150 which perform certain tests embedded in those ROM packs, or causes accesses to built-in diagnostics contained within the UUT. In the Macintosh family of personal computers, a series of routines known as the "Test Manager" is available in the system ROM of each computer. On a system which is not even able to power up and complete bootstrap initialization, this program will be unavailable. Therefore, certain "lowlevel" tests perform certain basic diagnostics such as testing a "power on" battery on the motherboard, testing voltage levels on certain signal lines, determining whether there is SCSI termination, or measuring the voltage of SCSI termination. A summary of these tests is set forth below. Each of these low level tests is written in 68HC11 assembly language for CPU 901 in the preferred embodiment but may be written in high level languages such as the "C" or Pascal programming language in alternative embodiments. These tests are perforated without entry into the diagnostic program by measuring voltages available on the various connectors, etc. which are coupled to tool 100 and a UUT. These tests are as follows:

Tests that Do Not Require the Test Manager to Function

Power Supply (PowrS)—This test measures the voltage at the power supply of the UUT. The value can range from 0.0 volts to 5.5 volts. This test runs on UUT's in the Macintosh brand of personal computers. This test has no pass/fail. It displays the voltage with a message stating what range of values indicates a functional power supply (usually >4.5 volts). This test requires a cable to be connected to a UUT and either port 610 or 620.

Battery Voltage (Batt.)—This test measure the battery voltage off the ADB cable. The value can range from 0.0 volts to 10.0 volts. This test runs on Macintosh II motherboard and IIx brand computers. This test has no pass/fail. It displays the voltage of the battery with a message stating what range values indicates a functional power supply (usually >6.5 volts). This test requires a cable to be connected from a UUT to either port 610 or 620.

Power Up Voltage (PwUpV)—The Macintosh IIcx brand computer uses a trickle current from the power supply to provide power up voltage (which is provided by a battery on the motherboard). This test measures the trickle current off a cable coupled to 610 or 620. The value can range from 0.0 volts to 10.0 volts. It is very similar to battery voltage. This test has not pass/fail. It displays the voltage with a message stating what range of values indicates a functional power supply (usually >4.5 volts). This test requires a cable to be coupled to a UUT and either port 610 or 620.

Power On CPU—This function, by imitating the action of pressing the soft power on key activates power in the UUT. This function runs on Macintosh II, IIx and IIcx brand personal computers. This function has no pass/fail. This test requires one cable to be connected from a UUT to port 610 or 620.

SCSI Termination Check—This test checks the SCSI lines to see if a good termination exists on the bus. This test runs on all Macintosh brand personal computers. This test has pass/fail only. This test requires a SCSI cable to be connected from port 660 to the UUT.

SCSI Termination Power—This test measures the termination voltage off the SCSI bus. The value can range from 0.0 volts to 5.0 volts. This test runs on all members of the Macintosh brand personal computer family although may also run on other computers having a SCSI connector similar to 600. This test has no pass/fail. It displays the termination voltage with a message stating what range of values indicates a functional terminator (usually >4.5 volts). This test requires a SCSI cable to be connected from connector 660 to the UUT.

Termination [On/Off]—This function turns on (or off depending on the previous state) the internal termination power of the SCSI bus in diagnostic tool 100. This function runs on all members of the Macintosh brand personal computer family. This function has no pass/fail. It displays the termination condition as on or off on the screen. This function requires the SCSI cable to be connected to connector 660 and the UUT.

SCSI Reset—This function forces a hard SCSI reset on the bus. This function runs on all SCSI type hard drives. This function has no pass/fail. This function requires a SCSI cable to be connected to connector 660 and the drive.

SCSI Bus Scan—This test scans the SCSI bus looking for hard drives. It builds a table of any drives it finds and allows the user to obtain information about each drive such as drive type manufacturer and size. This test runs on all SCSI type hard drives. This test has no pass/fail. This test requires the SCSI cable to be connected to connector 660 and the SCSI bus being tested.

Test Manager Entry ("TstMd")—This function enters the Test Manager on the UUT. It cycles power and uses the SCSI bus to jump into the Test Manager on the UUT. This function runs on all machines equipped with a SCSI chip and having a Test Manager diagnostic program. This function fails only if it is not successful in entering the Test Manager. This function requires that cables be connected from the UUT to 660, 610 or 620, and a serial cable for the modem to be connected to port 630 or 640. The process of entering the Test Manager is discussed in more detail with reference to FIGS. 12a through 12d.

Entering the Test Manager Diagnostic System

If the system is able to receive system power, however, the Test Manager diagnostic program may be entered in the UUT to perform certain tests at the user's choosing using diagnostic tool 100. There are two ways in which the Test Manager is entered in a Macintosh brand personal computer using the preferred embodiment: by manually initiating a "non-maskable interrupt" (NMI) switch 620 on a Macintosh brand personal computer; or by causing the UUT to enter the Test Manager by simulating a SCSI device such as a disk drive and jumping to the Test Manager. The former option is difficult because the NMI switch must be issued within five to ten seconds after the UUT commences a bootup. Fairly tight timing constraints must be adhered to in order to enter the Test Manager in this manner. In UUT's which are able to initiate system power and perform bootstrap initialization from an attached SCSI device, the latter method to enter the Test Manager is preferred. This is discussed in more detail with reference to FIGS. 12 through 15.

Figure 12A:
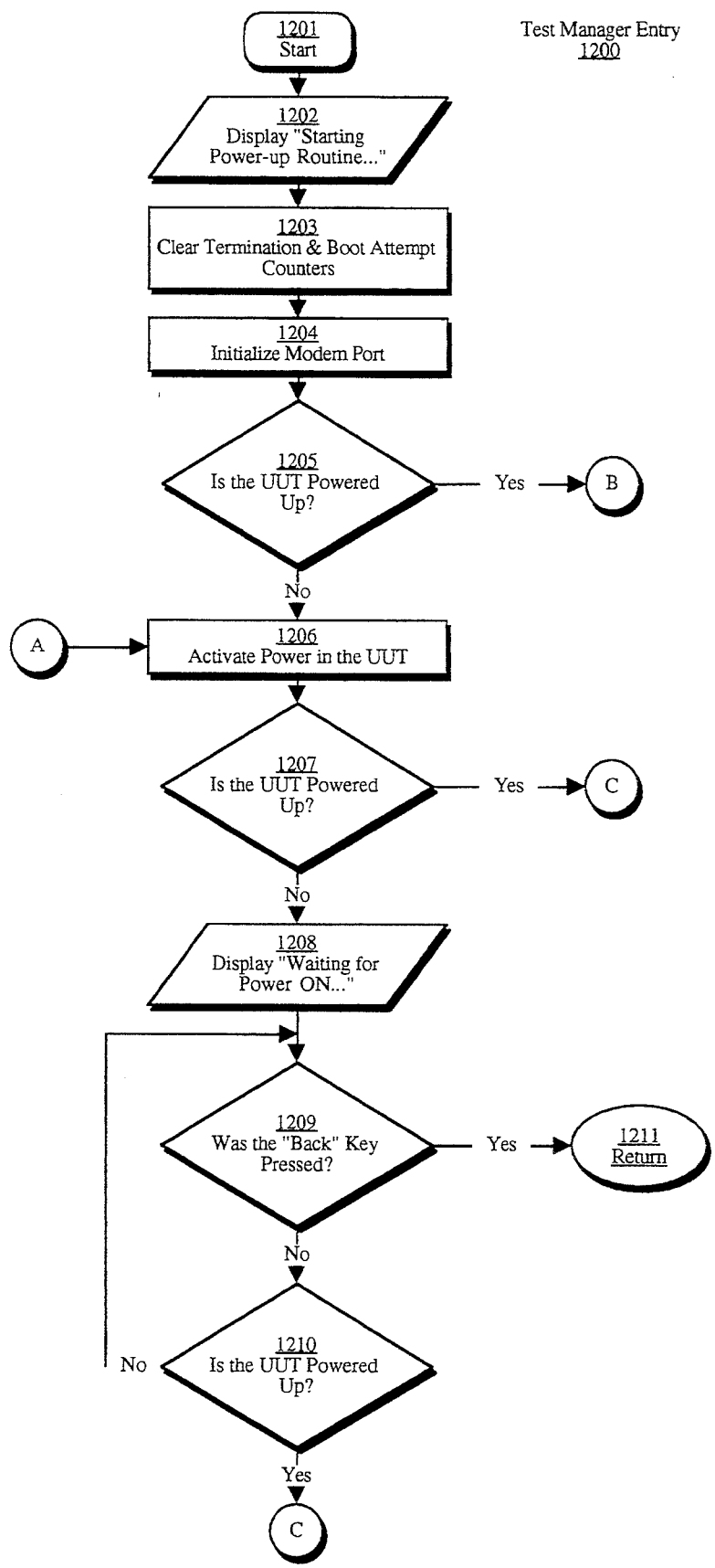
FIG. 12a-12d are flowcharts showing various ways to enter test routines used in the diagnostic device of the preferred embodiment.
Figure 12B:
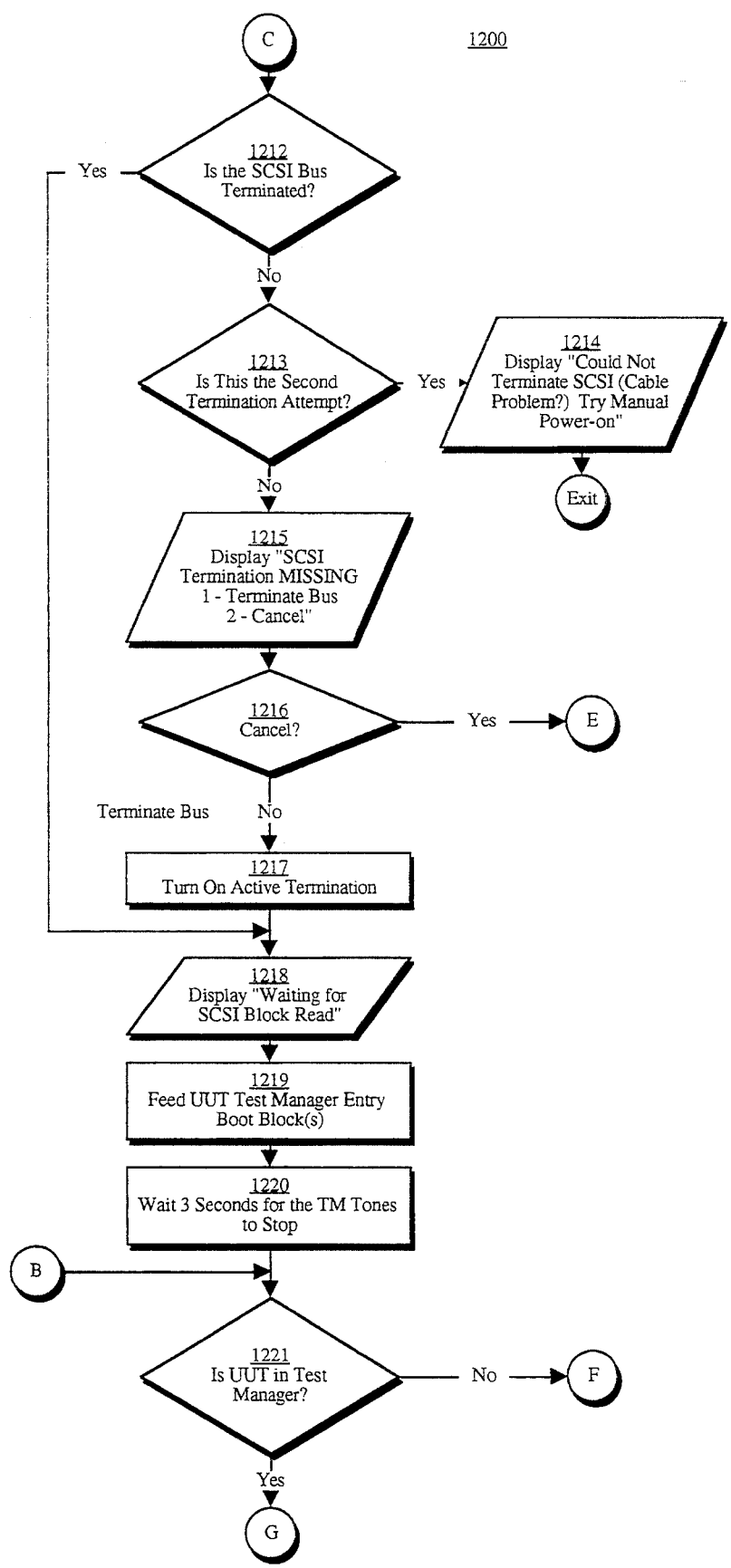

FIGS. 12a through 12d show one process 1200 which checks certain basic conditions in the UUT and attempts to enter the Test Manager. Prior to bootstrap initialization from the simulated SCSI device provided by device 100, certain basic conditions need to be established and tested for. Various corrective measures are taken to try to enter the Test Manager if entry is not successful on the first attempt. This process is shown in FIGS. 12a through 12d. When a UUT is connected to tool 100 for performing diagnostics, process 1200 is executed by tool 100 in order to attempt to enter the Test Manager. Process 1200 starts at step 1201, as shown in FIG. 12a, by displaying to the user at step 1202 that power-up routine is being initiated in the UUT. At step 1203, the SCSI bus termination and boot attempt counters, which are used for multiple attempts to terminate the SCSI bus or attempt to initialize the system, are cleared. The serial modem port 430 on tool 100 is initialized at step 1204 in order to prepare the unit for communication with a UUT. At step 1205, it is determined whether the UUT is already powered up. If power is present in the UUT, then process 1200 proceeds to step 1221 as shown in FIG. 12b. It is determined whether the UUT is powered up, in a Macintosh brand computer system, using techniques well-known to those skilled in the art by sampling certain lines coupled to either ports 610 or 620 of peripheral port pack 160. If the UUT is not powered up, as determined at step 1205, then process 1200 proceeds to step 1206 wherein a power-up is attempted on the UUT using the sequence issued over port 610 or 620 on port pack 160 for certain models of the Macintosh brand computer. Again, it is determined at step 1207 whether the UUT has system power, and if it does, then process 1200 proceeds to step 1212 on FIG. 12b. If not, as determined at step 1207, the message "Waiting for power on" is displayed at step 1208, and process 1200 in FIG. 12a proceeds. It is then determined, at step 1209, whether the "Back" key has been depressed by the user. This key allows the user to abort from any process currently executing in tool 100. This is used if the user wishes to escape out of the waiting for power on loop of steps. 1209 and 1210. If the "back" key is depressed, then process 1200 returns from Test Manager entry sequence 1200 at step 1211. If the "back" key has not been depressed as determined at step 1209, then the UUT is tested again at step 1210 to determine whether system power is present. Steps 1209 and 1210 are repetitively performed until it is detected that the UUT has powered up as determined at step 1210. Once power is present, step 1210 proceeds to step 1212 in FIG. 12b.

As shown in FIG. 12b, process 1200 continues at step 1212 wherein it is determined whether SCSI bus termination is present in the UUT. If SCSI bus termination is present, then 1212 branches to step 1218 to continue the initialization. If SCSI bus termination is not present, then process 1200 proceeds to step 1213. 1213 determines whether this is the second attempt to terminate the SCSI bus, and if it is, step 1213 proceeds to step 1214 wherein the message "Cannot terminate SCSI (cable problem?), Try manual power on" is displayed to the user. Then, process 1200 branches to the exit process at step 1228 shown in FIG. 12d, and process 1200 is returned from at step 1235. If, however, this is not the second attempt to terminate the SCSI bus, then step 1213 proceeds to step 1215 wherein the user is prompted with the message that "SCSI termination is missing," and the user is given the option to either "1) Terminate the bus or 2) cancel" the present operation. It is determined at step 1216 which option the user selected. If "cancel" is selected, step 1216 proceeds to step 1235 on FIG. 12d and process 1200 is returned from. If, however, the "cancel" selection was not made, as determined at step 1216, then SCSI termination is attempted to be activated at step 1217 as shown in FIG. 12b. SCSI termination is performed, in the manner as discussed earlier, using soft SCSI termination circuitry 1010 as shown in FIG. 11. Then, the message "Waiting for SCSI block read" is displayed at step 1218, wherein tool 100 waits until the UUT attempts to read from the simulated SCSI device over port 660. Tool 100 will cause the UUT to enter the Test Manager by "feeding" blocks to the UUT at step 1219. This is discussed in more detail with reference to FIG. 13. Tool 100 then waits three seconds in order for the Test Manager to be entered at step 1220 after the issuance of the entry sequence at step 1219. It is determined at step 1221, whether the UUT is in the Test Manager. If the UUT is not in the Test Manager, then process 1200 proceeds to step 1222 in FIG. 12c. If, however, the UUT was in the Test Manager, then process 1200 proceeds to step 1224 in FIG. 12d.

Figure 12C:
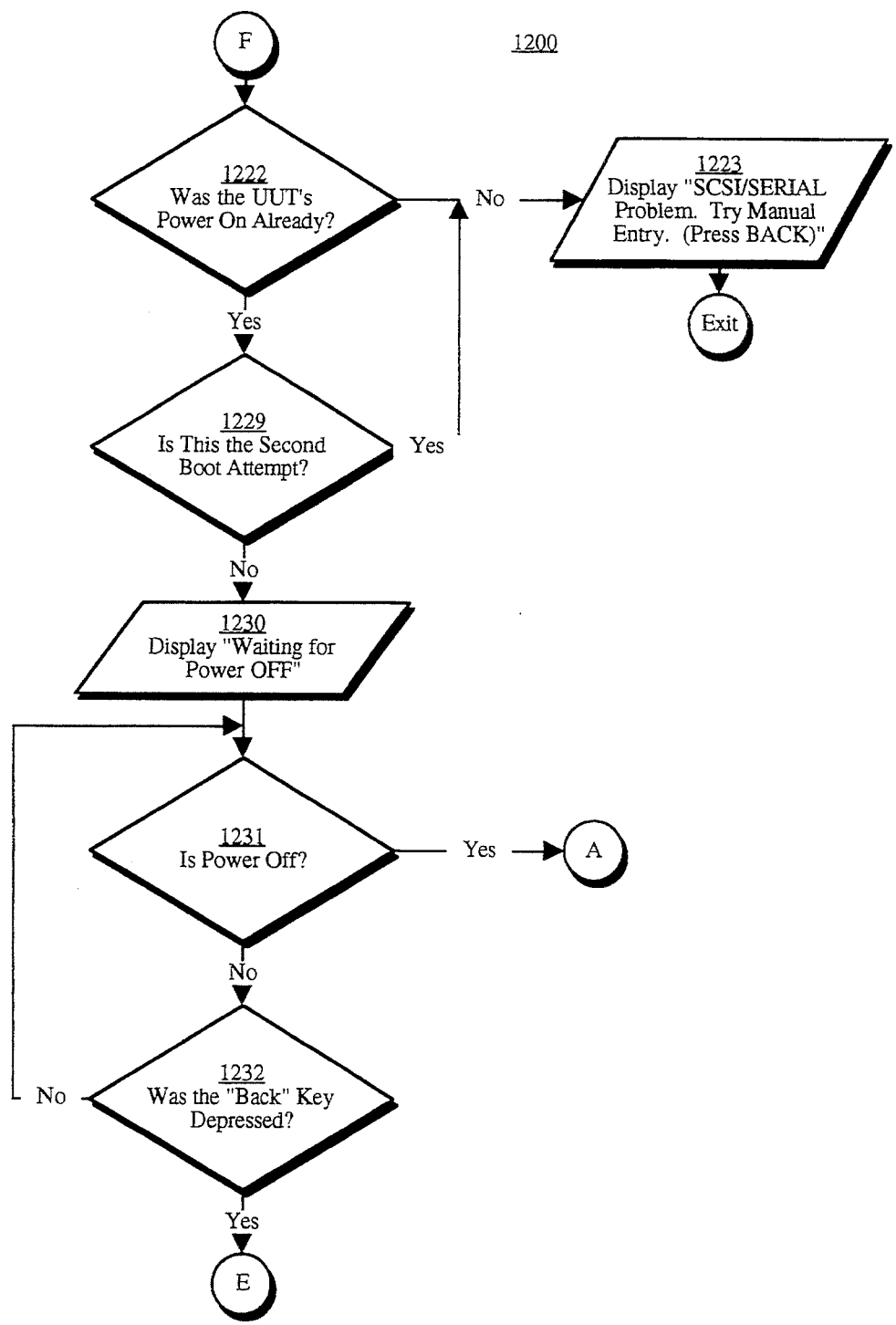
Figure 12D:
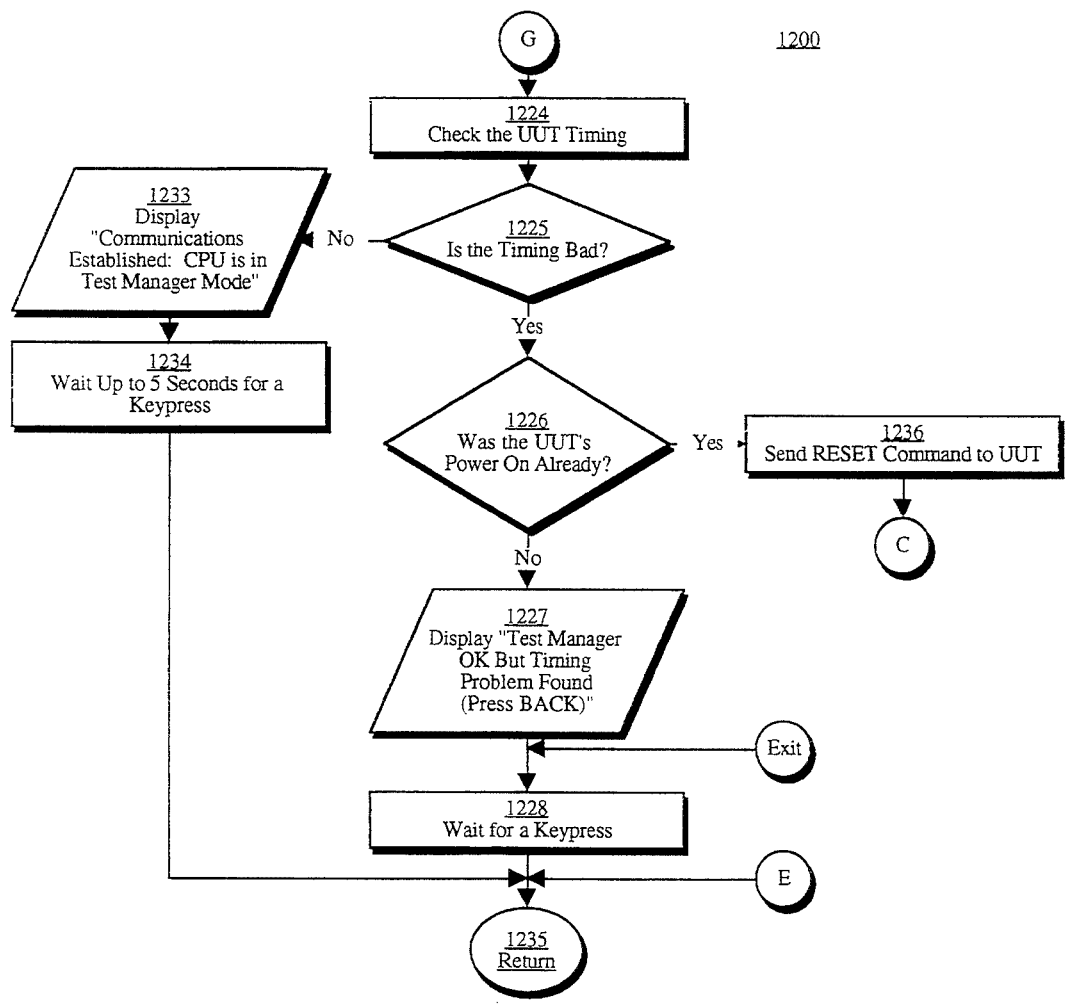

As shown in FIG. 12c, process 1200 continues at step 1222 wherein it is determined whether UUT power was on already, or whether the power-on sequence at step 1206 had to be performed. If power was already on in the UUT, then process 1200 proceeds to step 1229 wherein it is ascertained whether this is the second attempt to boot the Test Manager in the UUT. If it is the second attempt to boot, then the message "SCSI/serial problem. Try manual entry (press BACK)" is displayed at step 1223. If process 1200 activated power in the UUT, then step 1222 also proceeds to step 1223 to display the message. After the message if step 1223 is displayed, the exit process at step 1228 shown in FIG. 12d is performed, and process 1200 is returned from at step 1235. If this is not the second boot attempt as determined at step 1229, then the message "Waiting for power off" is displayed at step 1230, and the UUT is checked via ports 610 and 620 to see whether power is off in the UUT at step 1231. If it is not, and the "back" key was not depressed (causing interruption of process 1200), then steps 1231 and 1232 are performed repetitively until it is determined at step 1231 that power is off in the system, or the "back" key is depressed. When power-off is detected in the UUT at step 1231, then process 1200 proceeds back to step 1206 to issue a "Power-on" signal to the UUT as shown in FIG. 12a. If the "back" key is depressed, as determined at step 1232 (interrupting Test Manager Entry Process 1200), then process 120)is returned from at step 1235 shown in FIG. 12d.

If the UUT was not in the Test Manager as determined at step 1221 in FIG. 12b, then process 1200 proceeds to step 1224 in FIG. 12d. Step 1224 in FIG. 12d checks the UUT's tinting. This is determined using techniques well-known to those skilled in the art by sampling various signals received over the ports on port pack connector 160 to see if the UUT is responding within defined tolerances. If the timing is bad as determined at step 1225, then process 1200 proceeds to step 1226. If the timing is not bad as determined at step 1225, then the message "Communications established: CPU is in Test Manager mode" is displayed at step 1233, and tool 100 waits an additional five seconds for a user intervening keypress, at step 1234. If no keypress is received, process 1200 returns at step 1235. If, however, the timing was bad as determined at step 1225, then process 1200 proceeds to 1226 to determine whether tool 100 activated power in the UUT. If power was on already (tool 100 didn't activate the power), then a "RESET" command is issued to the UUT at step 1236 and process 1200 continues at step 1221 as shown in FIG. 12*b*. If power was activated in the UUT by tool 100, then the message "Test Manager OK but timing problem found" is displayed at step 1227, and the exit process is branched to at step 1228. Then, process 1200 is returned from at step 1235.

Thus, at the end of process 1200, the UUT should be in its Test Manager mode, or the user is prompted with various options that he may take in order to perform diagnostics on the UUT. The entry into the Test Manager by simulating a SCSI device mentioned with reference to step 1219 will now be discussed.

Entry Into the Test Manager by Simulating a SCSI Device

Entry into the Test Manager is performed by diagnostic tool 100 by simulating a SCSI device to the UUT. This is accomplished by sensing signals received through connector 660 transmitted by the UUT. When the appropriate SCSI initialization signals are received through port pack 160 from a UUT coupled to connector 660, diagnostic tool 100 issues response signals through connector 660 to the UUT to cause the system to jump to the Test Manager. It performs this by simulating a SCSI device such as a disk drive using a driver descriptor map (DDM) and partition map entry which is expected by certain UUT's using SCSI devices. These entries are shown in more detail in FIGS. 14 and 15. As is well-known to those skilled in the art, a computer system having a SCSI interface, such as a UUT probes the SCSI bus to determine if SCSI devices are present. Each SCSI device identifies itself with an identification number. This is known as the arbitration phase. Once ID's have been sampled by the UUT, selection of a device may be accomplished. This is known as the selection phase. After arbitration and selection, the UUT can issue a command (such as a read or a write) and the device will respond with data. The preferred embodiment senses the issuance of the arbitration and selection signals, and simulates a SCSI device with an ID=6, which is the default highest priority SCSI ID number besides the UUT in a Macintosh brand computer. Other responses to probes by the UUT are now discussed. These are performed, as is well-known to those skilled in the art, by sensing the arbitration, selection, and command signals sent by the UUT, and device 100 responds in a manner expected from a SCSI device. The signals issued to the UUT will now be discussed.

Figure 13:
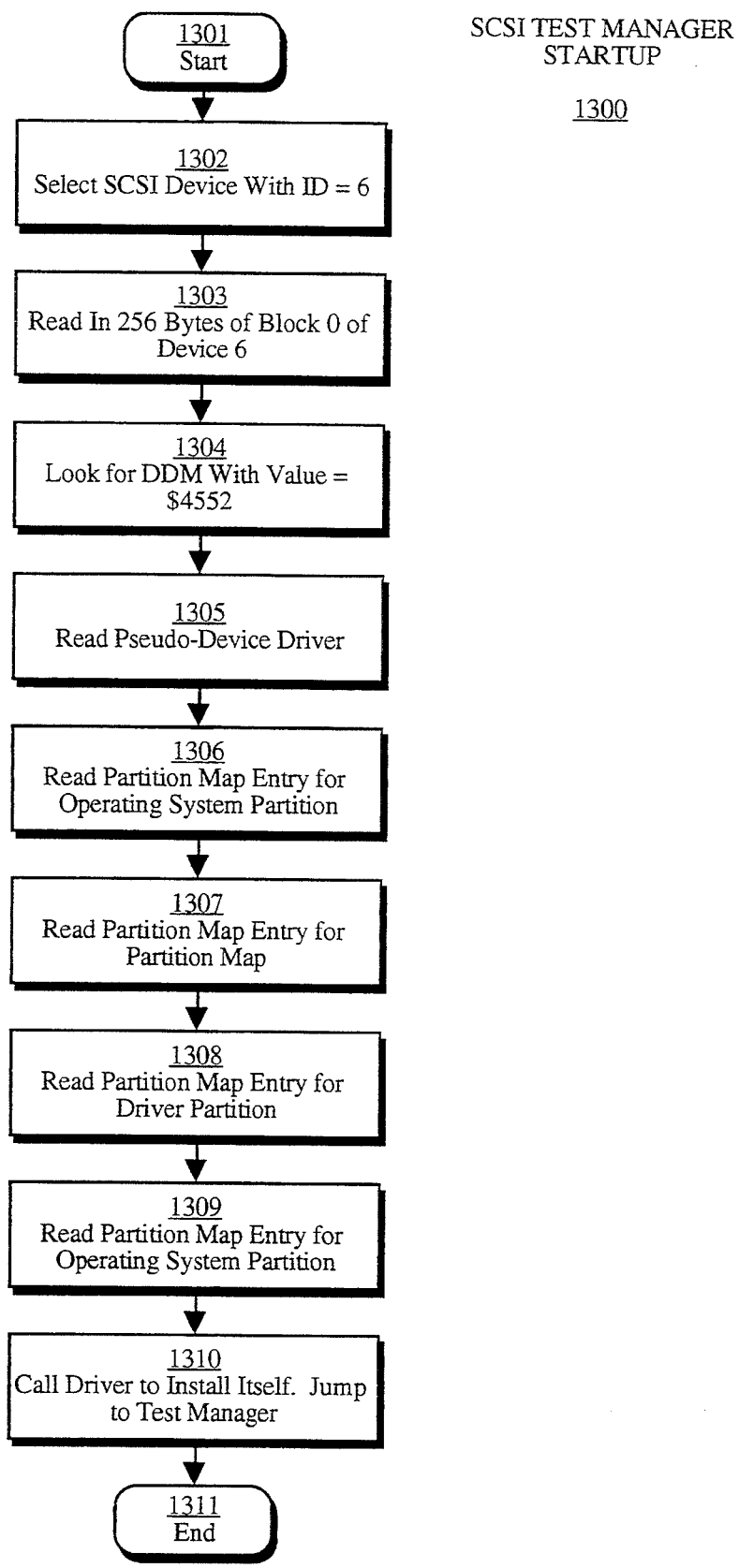
Figure 14:
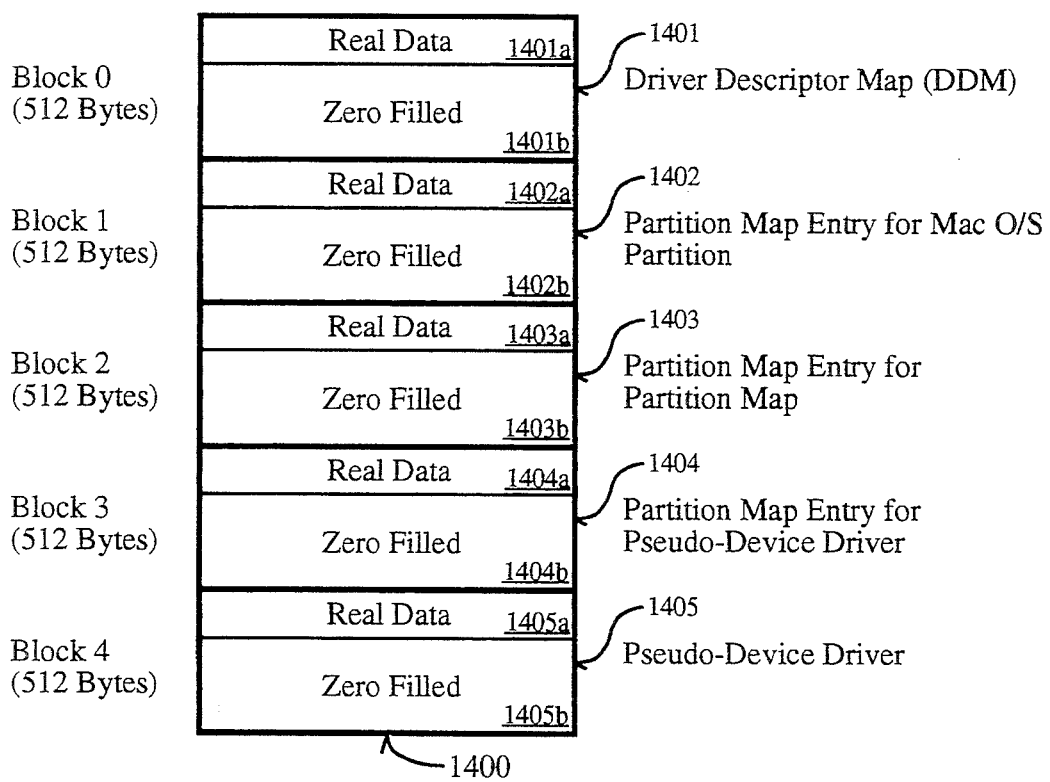

The SCSI Test Manager entry process performed by the UUT is shown as 1300 in FIG. 13 (referred to in step 1219 of process 120)). Process 1300 is performed by a UUT when allowed to continue to perform bootstrap initialization and has a SCSI device coupled to one of its ports through port 660. Process 1300 starts at step 1301 wherein, at step 1302, a first available SCSI device on the bus is selected that has an ID=6 (this is the highest priority SCSI device in a Macintosh brand computer). When the UUT requests an access to the SCSI device having ID=6, diagnostic base unit 190 senses this signal and transmits responsive data to the UUT via port pack 160. The fore, at of data responsive to requests issued by the UUT is shown in FIG. 14 and is shown in more detail in FIGS. 14 and 15. At step 1303, the UUT will attempt to read the first 256 bytes of block 0 of this simulated device by issuing read commands through port 660 to tool 100. Block 0 1401 is shown with reference to FIG. 14. This contains the driver descriptor map (DDM) for the simulated SCSI partition. The UUT attempts, at step 1304, to look for a driver descriptor map such as 1401 with a value equaling $4552 (this indicates that the SCSI device has been formatted). This is indicated as field 1501 in FIG. 15. Upon receiving the address for the first 256 bytes of block 0 of the unit with ID=6, diagnostic tool 100 transmits DDM 1401 onto the SCSI bus. Driver descriptor map 1401 comprises two portions, 1401 a and 1401*b*. 1401*a* contains "real data" which resides in non-volatile memory of tool 100 and is transmitted to the requesting UUT. The remaining portion 1401*b* of the data is zero-filled and transmitted to the UUT through port 660 byte-by-byte from a register in tool 100. The remaining blocks shown in FIG. 14: 1402*b*, 1403*b*, 1404*b*, and 1405*b* are similarly zero-filled and transmitted to the UUT. The remaining "real" portions of driver descriptor map 1401*a* is shown in FIG. 15. Driver descriptor map 1401*a* indicates the size in blocks of the device in field 1502 (a one word field) and the number of blocks on the device in field 1503 (a 32-bit longword). Blocks are 512 bytes long, in a preferred embodiment. Field 1504 indicates the device type (a one for disk drive), 1505 has the device ID type (one). Field 1506 also contains a one, in the preferred embodiment, a value expected by Macintosh brand UUT's. The number of driver descriptors is contained in field 1507. In this example, there is only one. The driver descriptor starts at field 1508. The first block of the driver resides at block four as indicated by field 1508 (a 32-bit longword), and the driver size is exactly one block long as indicated by field 1509. Lastly, the driver type is of type 1, which is contained in field 1510, in the Macintosh brand family of personal computers. After the driver descriptor map is read at step 1304, step 1305 reads the pseudo device driver of the simulated SCSI device at block 4, shown as 1405 in FIG. 14. The format of blocks 1402 through 1405 are discussed with reference to FIG. 16.

Partition map entries, such as 1402, 1403, 1404, or 1405 are one-block entries containing information about the SCSI partitions which are being accessed. The pseudo device driver of the preferred embodiment resides in one of these partition map entries, and is shown as 1405 in FIG. 14. Each of the partition map entries has a specific format, which is well-known to those skilled in the art, and is set forth in *Inside Macintosh*, Volume V available from Addison-Wesley at pages V-576 through V-582. Because the actual data contained within fields in blocks such as 1402 through 1405 is well-known to those skilled in the art, a detailed discussion of that will not be set forth here. Each of the blocks 1402 through 1405 contains a first portion such as 1402*a* through 1405*a*, which contains real data in order to conserve space in the ROM of the preferred embodiment. The remaining portions such as 1402*b* through 1405*b* contain dummy data which is transferred to the UUT when request for the remainder of the block is made by the UUT. In each of the partition map entries 1402 through 1405, the actual portion read in by the UUT, 1402a through 1405a, is 64 bytes in length. The remaining portions 1402b through 1405b are padded with zeros. The partition map entries are then read by the UUT. At step 1306, the partition map 1402 for tile operating system is read. Once this is done, the partition map entry for the pseudo partition is read at step 1307. Then, the partition map entry 1404 for tile driver is read in at step 1308. This gives the system the address at which to start to execute the driver contained in 1405. Then, at step 1309, the partition map entry for the operating system 1402 is read again. At step 1310, the driver residing at the location indicated by 1404 is called to install itself and the driver causes a jump to the Test Manager to occur. Once process 1300 is complete, at step 1311, the Test Manager is running in the UUT, which can now be accessed and communicated with by diagnostic tool 100.

In summary, diagnostic tool 100, in one embodiment of the invention, simulates a SCSI device with an ID=6 for a Macintosh brand personal computer. A series of requests is made to tile device to read various information off a simulated SCSI device. Blocks are returned from this simulated device as shown in FIG. 14 and described with reference to FIG. 13, and tile diagnostic device 100 returns blocks which are expected by the UUT. Blocks are fed to the UUT in tile following order: 1401, 1405, 1402, 1403, and 1402. As a last step, the device driver residing in block 1405 is called to execute itself thus causing a jump to occur to the Test Manager which resides in the UUT system ROM.

Once entry into tile Test Manager of tile UUT has been perforated, various tests within the Test Manager may be accessed and executed. It can be appreciated by one skilled in the art that other architectures possessing similar test routines may be accessed in a similar manner. This will allow entry and testing in an automated fashion by diagnostic apparatus 100. The commands set forth in Table 4 are provided for execution of the Test Manager remotely via a coupling with the UUT to serial port 640 on port pack 160. Each command is preceded by a "*" which indicates that a command is following on serial port 640. When a UUT is activated and the Test Manager is entered, in one embodiment, the serial port of the UUT defaults to a 9600 baud configuration and expects "*" commands to be received via serial port 640 coupled to the serial port of the UUT. Responses to tests requested by diagnostic apparatus 100 are also provided across the serial port. Specific commands are summarized as follows:

TABLE 4

| Initiating Command | UUT Response | Command Name | Description |
| --- | --- | --- | --- |
| *S | *S | Stop initial input message and Start UUT ROM Monitor | This command is the "handshake" that initializes the UUT ROM monitor to accept test commands. It also silences the UUT (if the UUT sends out a repeating error message upon failure or if the ROM monitor has been invoked). |
| *L xx xx xx xx | *L | Load address | This command is followed by 4 bytes that specify the address where the UUT will start loading (or downloading) data into RAM. Response indicates that the UUT received the valid command (handshake). Can be used to load tests into the UUT. |
| *B xx xx | *B | Byte count | This command is followed by 2 bytes that specify the number of bytes to be downloaded. (*L must precede this command). Response indicates UUT received the valid command (handshake). |
| *D xx | *D | Download data | This command is followed by xx xx (2 hex) bytes as specified by the *B command. (*L & *B must precede this command). Response indicates UUT received valid command (handshake). |
| *C xx xx xx xx | *C | Checksum data | This command requests memory range checksum specified by starting location and number of bytes (via *L and *B respectively). Returns checksum followed by *C. Must be used with *L and *B. |
| *G xx xx xx xx | *G | Go . . . (execute) | This command is followed by 4 hex bytes that specify the address where the UUT will start running a program. (To run a downloaded program, *L, *B, and *D must precede this command). Response indicates UUT received the valid command (handshake). |
| *Oxx xx xx xx | *0 | O = low or bottom RAM test address | This command is followed by 4 hex bytes that specify the address where the UUT will start running a RAM test. (A pointer). Response indicates UUT received the valid command (handshake). |
| *1 xx xx | *1 | 1 = high or top | This command is followed by 4 hex bytes that specify the address where the UUT will start running a RAM test. (A pointer). Response indicates UUT received the valid command (handshake). |
| *2 rr | *2 | Read CPU register | Requests CPU register data specified by rr. Response returns 32-bit register information from the UUT CPU register, rr. The |

TABLE 4-continued

| Initiating Command | UUT Response | Command Name | Description |
|---|---|---|---|
| | | | register dump is followed by *2 to indicate the end of transmission. |
| *3 rr xx xx xx xx | *3 | Write CPU register Registers: D0–D7 SP A0–A6 SR | Writes 32-bit value to register specified by rr. Example: *3D301F9AB35*3 *2SP_____000E952*2 Underlined section returned by Test Manager) |
| *4 | *4 | Clear UUT error register. (e.g., D6.L & D7.W) | Clears the error storage registers on the unit under test. Response indicates UUT received the valid command (handshake). |
| *5 | *5 | Re-enter ROM monitor | Re-starts ROM monitor entry and re-calls generic header (e.g., *APPLE*xxxxxxxxxxx*1*). Response indicates UUT received the valid command (handshake). |
| *A | *A | ASCII mode | Sets ASCII character mode. Sends and receives ASCII data. Response indicates UUT received the valid command (handshake). |
| *H | *H | Hex mode | Sets hex character mode. Sends and receives hex data. Response indicates UUt receives the valid command (handshake). |
| *R xx xx xx xx xx xx | *R | Result request | Requests current status or test results. Response returns a 12-character result code that specifies the current error status. |
| *M xx . . . | *M | Memory dump | Requests memory data specified by *L and *B (*L and *B must precede this command). Response returns memory information as specified by the *L and *B commands. The memory dump is followed by *M to indicate the end of transmission. |
| *E | *E | Echo | Requests the UUT to echo externally transmitted characters back to the external device. Response indicates UUT received the valid command (handshake). |
| *I | *1 | Initialize | Requests the UUT to re-initialize itself. This terminates serial communications. (Re-boot). |
| *T tt tt pp pp oo oo | *T | ROM-resident Test request | Requests the UUT ROM test to be run. This command is followed by 8 hex bytes; "u u" is the "pass count" (or number of times test is to be run); "oo oo oo oo" is the option word. Response indicates UUT received the valid command (handshake). Examples of ROM Test number (tt tt) activities: 0000 - Size Memory 0001 - DataBus Test 0002 - Mod3Test 0003 - Addrline Test 0004 - ROMTest 0005 - Rev3ModTest 0006 - StartUpROMTest |

An additional feature provided by the Test Manager is the ability to download specific tests into the Test Manager. This is performed using the "*D" command and such tests may be executed by typing in the "*G" command with the address of the test loaded using the "*D" command. The last command in any user-specified test using "*D" must jump back to the starting address of the Test Manager to provide the appropriate response to diagnostic tool 100. It can be appreciated by one skilled in the art that a variety of entries into system-specific test functions such as the ones provided above may be performed.

Tests Requiring the Test Manager

Most of tile tests run ell diagnostic tool 100 require the UUT to be in the Test Manager. This requires the machine to have a limited amount of functionality. Most of these tests download a piece of code into the UUT to run in the native environment. If the user attempts to run one of these tests without being in the Test Manager, he will be given a prompt to enter the Test Manager by diagnostic tool 100. In order to enter the Test Manager automatically, each test requires that the UUT be coupled to ports 660 and 610 or 620 using appropriate cables. Also, tool 100 must be coupled to the UUT through port 630 using a serial cable to communicate with the Test Manager.

ROM Checksum (ROMck)—This test checksums all of the ROM's in the CPU (if more than one exists). This test will not identify individual ROM failures. This test fails if the checksum does not match the one stored in the ROM, otherwise it passes.

RAM Size (RAMsz)—This test determines the size of the RAM in the CPU. The test finds the largest SIMM in the bank and uses that to determine the size. For example, if the test finds three 256K SIMM's and one 1 Meg SIMM, it will size the machine to 4 Megs. This test has no pass or fail. It reports the size of memory it finds and indicates if it thinks the memory is misconfigured (a system where the largest SIMM's are in bank A instead on bank B) or bad (which may just be mismatched (a system which has different size SIMM's in the same bank)).

Address Test (Addr.)—This test checks the address lines of the CPU. It determines if the lines are functioning properly. This test has pass or fail only.

Databus Test (Data)—This test checks the data lines of the CPU. It determines if the lines are functioning properly. This test graphically shows catastrophic errors and missing SIMM's.

SIMM's Test (SIMMs)—This test uses the results from RAM Size to read and write RAM to determine if it is good. This test graphically shows catastrophic errors, missing SIMM's and individual bad SIMM's.

VIA Test (VIA)—This test checks the VIA's (Versatile Interface Adaptors or Peripheral Controller Chips) for functionality. This test gives pass or fail only.

Clock Test (Clock)—This test checks the UUT real time clock chip for functionality. This test gives pass or fail only.

Parameter RAM Test (P/RAM)—This test verifies that the PRAM (parameter RAM which controls data, and mouse information) can be read from and written to. This test gives pass or fail only. NOTE: There are two modes of operation for this test. One mode saves and restores the contents of PRAM (parameter RAM of the UUT), and the other mode clears out all of PRAM.

SCC Test (SCC)—This test verifies that the SCC chip functions in all modes and that the serial bus can send and receive data correctly. This test gives pass or fail only.

SCSI Test (SCSI)—This test verifies that the SCSI (small computer system interface) chip functions in all modes and that the SCSI bus can send and receive data correctly. This test gives pass or fail only.

SWIM/IWM Test (SWIM)—This test determines if the CPU has an IWM or a SWIM (floppy disk controller chips) connected and then tries to initialize the chip. This test gives pass or fail only. This test can only detect catastrophic failures in the IWM/SWIM. The floppy drive tests provide a more comprehensive test of the chip.

FPU Test (FPU)—This test verifies that the FPU chip (floating point math coprocessor) functions. This test runs on Macintosh II, IIx, IIcx brand family of personal computers. This test gives pass or fail only.

Sound Test (Sound)—This test verifies that the sound chip registers function and that data can be read from and written to the chip. This test also measure the sound out for volume and frequency. This test gives pass or fail only.

ADB Test (ADB)—This test verifies that the ADB (mouse and keyboard) transceivers, the portions of the VIA that control ADB, the ADB line and the ADB port is functional. This test gives pass or fail only. This test requires that both ADB cables be connected from the UUT to ports 610 and 620.

Video Card Test (Video)—This test determines what video cards are in what slots and builds a menu for the user. The user can select which card he wants to test. The test will then test the RAM on the selected video card. This test runs on the Macintosh II, IIx, and IIcx brand family of personal computers. This test gives graphic representation of which SIMM's are bad or fails the card if the soldered SIMM's are defective.

Floppy Drive Test (Drive)—This test determines what floppy drives are in what ports and builds a menu for the user. The user can select which drive he wants to test. It then tests the ability of the drive to read, write, and seek. This test gives pass or fail only.

Power Off CPU—This test shuts off power to the CPU. This test funs on Macintosh II, IIx, and IIcx brand family of personal computers.

Thus, an invention for diagnosis for computer systems has been described. Although the present invention has been described particularly with reference to FIGS. 1 through 15, it will be apparent to one skilled in the an, however, that the present invention has utility far exceeding that disclosed in the figures. It is contemplated that many changes and modifications may be made, by one of ordinary skill in the art, without departing from the spirit and scope of the present invention as disclosed above.

What is claimed is:

1. A device for terminating a bus comprising:
   a. first means for activating termination of the bus;
   b. second means coupled to the first means for supplying power, the second means supplying power upon activation of the first means;
   c. third means coupled to the second means for limiting voltage received from the second means; and
   d. fourth means coupled to the third means for limiting transient voltages on the bus.

2. The device of claim 1 wherein the first means comprises a flag.

3. The device of claim 1 wherein tile second means comprises a MOS-FET wherein the source of the MOS-FET coupled to a power supply, drain is coupled to the third means, and tile gate is coupled to the first means.

4. The device of claim 1 wherein the third means comprises a low dropout voltage regulator.

5. The device of claim 1 wherein the fourth means comprises at least one diode.

* * * * *